(12) United States Patent
Kawachi et al.

(10) Patent No.: US 10,074,331 B2
(45) Date of Patent: Sep. 11, 2018

(54) DISPLAY DEVICE

(71) Applicant: Panasonic Liquid Crystal Display Co., Ltd., Hyogo (JP)

(72) Inventors: Genshiro Kawachi, Hyogo (JP); Kazuo Kita, Hyogo (JP); Yoshihisa Ooishi, Hyogo (JP); Hideyuki Nakanishi, Hyogo (JP); Toshikazu Koudo, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 146 days.

(21) Appl. No.: 15/159,343

(22) Filed: May 19, 2016

(65) Prior Publication Data
US 2016/0267869 A1 Sep. 15, 2016

Related U.S. Application Data

(63) Continuation of application No. PCT/JP2014/005659, filed on Nov. 11, 2014.

(30) Foreign Application Priority Data

Nov. 20, 2013 (JP) .................................. 2013-239981
Nov. 20, 2013 (JP) .................................. 2013-239985

(51) Int. Cl.
*H01L 27/32* (2006.01)
*G09G 3/36* (2006.01)
(Continued)

(52) U.S. Cl.
CPC ......... *G09G 3/3677* (2013.01); *G09G 3/3208* (2013.01); *G09G 3/3266* (2013.01);
(Continued)

(58) Field of Classification Search
CPC .. G09G 3/3208; G09G 3/3266; G09G 3/3677; G09G 2300/0408;
(Continued)

(56) References Cited

U.S. PATENT DOCUMENTS 5,151,689 A * 9/1992 Kabuto ................ G02F 1/1345
345/103
6,670,943 B1 12/2003 Ishii et al.
(Continued)

FOREIGN PATENT DOCUMENTS

JP 2-42420 2/1990
JP 2-210323 8/1990
(Continued)

OTHER PUBLICATIONS

International Search Report dated Feb. 17, 2015 in corresponding International Application No. PCT/JP2014/005659.
(Continued)

*Primary Examiner* — Michael J Eurice
(74) *Attorney, Agent, or Firm* — Wenderoth, Lind & Ponack, L.L.P.

(57) ABSTRACT

A display device includes an image display area that includes pixels sectioned by scanning signal lines and video signal lines, first scanning connection lines connected to scanning signal lines, first thin film transistors, first selection signal lines, second thin film transistors, second selection signal lines, and a scanning signal drive circuit connected to the first scanning connection lines, the first selection signal lines, and the second selection signal lines, wherein the scanning signal drive circuit sequentially supplies a pulse signal to the first scanning connection lines in a selection period in which a gate-on voltage is applied to the one of the first selection signal lines, and the scanning signal drive circuit applies a gate-off voltage to the one of the second
(Continued)

selection signal lines corresponding to the one of the first selection signal lines to which the gate-on voltage is applied.

19 Claims, 25 Drawing Sheets

(51) Int. Cl.
  *G09G 3/3266* (2016.01)
  *H01L 27/12* (2006.01)
  *G09G 3/3208* (2016.01)
(52) U.S. Cl.
  CPC .............. *G09G 2300/0408* (2013.01); *G09G 2310/0218* (2013.01); *G09G 2310/0248* (2013.01); *G09G 2310/0251* (2013.01); *G09G 2310/0264* (2013.01); *G09G 2310/0281* (2013.01); *G09G 2310/0297* (2013.01); *G09G 2310/061* (2013.01); *G09G 2310/062* (2013.01); *G09G 2310/065* (2013.01); *G09G 2310/067* (2013.01); *G09G 2320/043* (2013.01); *H01L 27/124* (2013.01)
(58) Field of Classification Search
  CPC ... G09G 2310/0218; G09G 2310/0248; G09G 2310/0281; G09G 2310/0297; G09G 2310/0251; G09G 2310/0264; G09G 2310/061; G09G 2310/062; G09G 2310/065; G09G 2310/067; G09G 2320/043; H01L 27/124
  See application file for complete search history.

(56) References Cited

U.S. PATENT DOCUMENTS

| | | | |
|---|---|---|---|
| 2001/0003448 A1 | 6/2001 | Nose et al. | |
| 2002/0075249 A1* | 6/2002 | Kubota | G09G 3/2011 345/204 |
| 2004/0066361 A1 | 4/2004 | Ishii et al. | |
| 2005/0057459 A1 | 3/2005 | Miyazawa | |
| 2005/0243588 A1 | 11/2005 | Kubota et al. | |
| 2006/0221040 A1 | 10/2006 | Pak et al. | |
| 2006/0267909 A1 | 11/2006 | Hsu et al. | |
| 2007/0091013 A1* | 4/2007 | Pak | G02F 1/13338 345/50 |
| 2007/0146354 A1 | 6/2007 | Kubota et al. | |
| 2008/0150932 A1 | 6/2008 | Takahashi | |
| 2010/0039361 A1 | 2/2010 | Hsu et al. | |
| 2010/0157189 A1 | 6/2010 | Ma | |
| 2011/0032284 A1 | 2/2011 | Owaku | |
| 2012/0026420 A1 | 2/2012 | Saitoh | |
| 2014/0139564 A1* | 5/2014 | Akimoto | G09G 3/3233 345/690 |
| 2015/0029081 A1* | 1/2015 | Kawachi | G02F 1/13452 345/92 |
| 2015/0129875 A1* | 5/2015 | Gotoh | G02F 1/136259 257/72 |
| 2015/0269884 A1* | 9/2015 | Sato | G09G 3/3233 345/76 |

FOREIGN PATENT DOCUMENTS

| | | |
|---|---|---|
| JP | 3-31893 | 2/1991 |
| JP | 10-253940 | 9/1998 |
| JP | 2000-227784 | 8/2000 |
| JP | 2001-147418 | 5/2001 |
| JP | 2002-32048 | 1/2002 |
| JP | 2003-29712 | 1/2003 |
| JP | 2006-285233 | 10/2006 |
| JP | 2006-330682 | 12/2006 |
| JP | 2008-77007 | 4/2008 |
| JP | 2009-50118 | 3/2009 |
| JP | 2011-39234 | 2/2011 |
| JP | 2012-32608 | 2/2012 |
| WO | 2013/179537 | 12/2013 |

OTHER PUBLICATIONS

International Search Report dated May 20, 2014 in related International (PCT) Application No. PCT/JP2014/000740.
International Search Report dated Apr. 8, 2014 in related International (PCT) Application No. PCT/JP2014/000617.

* cited by examiner

FIG. 8B

| Vo | VG | |
| | H | L |
| VCK | H | H | L |
| | L | Z | Z |

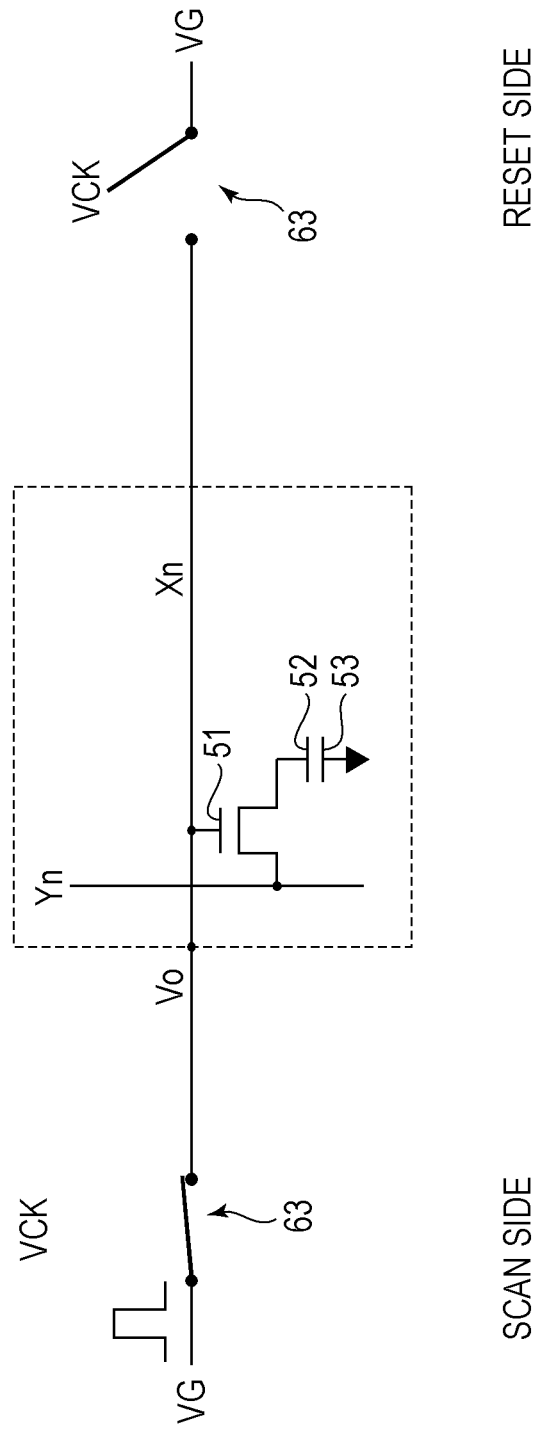

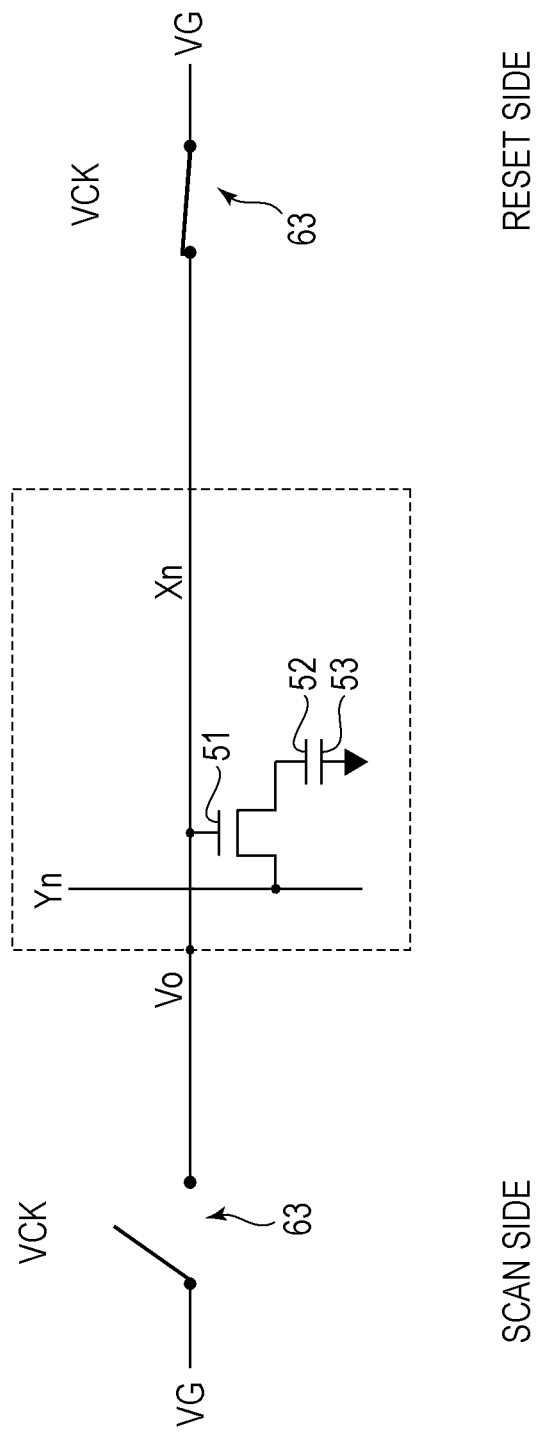

FIG. 10B

| Vo | VG | |
| | H | L |
| VCK | H | H | L |
| | L | L | Z |

DISPLAY DEVICE

CROSS-REFERENCE TO RELATED APPLICATION

This application is bypass continuation of international patent application PCT/JP14/005659, filed Nov. 11, 2014 designating the United States of America, the entire disclosure of which is incorporated herein by reference. Priority is claimed based on Japanese patent application JP2013-239981, filed Nov. 20, 2013 and Japanese patent application JP2013-239985, filed Nov. 20, 2013, the entire disclosures of which are incorporated herein by reference in their entirety.

TECHNICAL FIELD

The present disclosure relates to a display device.

BACKGROUND

In a general liquid crystal display device, a drive circuit is provided outside an image display area where a large number of pixels are arrayed to form an image to be displayed. The drive circuit applies, to a scanning signal line connected to gates of thin film transistors (TFTs) formed corresponding to the pixels, signals for controlling on and off of the TFTs. For example, a prior art discloses a liquid crystal display device in which drive circuits formed of TFTs are disposed on both right and left sides of a display area (See Japanese unexamined published patent application No. 2012-32608).

In a liquid crystal display device, there is a demand to achieve higher resolution, which corresponds to increasing the number of pixels in the image display area, and to achieve a narrower frame, which corresponds to reducing the size of an area outside the image display area.

In view of this, in the case where the drive circuit for the scanning signal line is provided outside the display device as in the liquid crystal display device disclosed in the prior art, the drive circuit is difficult to downsize beyond a certain limit due to a restriction of materials forming the drive circuit. This becomes pronounced in the case where the materials forming the drive circuit are materials, such as amorphous silicon and the like, which have relatively small electron mobility. For this reason, there is a limit on achieving a narrowed frame in the configuration in which the drive circuit for the scanning signal line is provided outside the display device, and it is difficult to further decrease a frame width by existing techniques.

At the same time, in the case where the scanning signal lines are individually connected to an integrated circuit by using wiring made of a material, such as metal, which has a large electric conductivity, the number of scanning signal lines to be connected is considerably increased in order to achieve high resolution of an image display area, and an area where the wiring is disposed is enlarged. Therefore, it is still difficult to decrease the frame width by the existing techniques.

SUMMARY

The present disclosure has been made in view of the above-mentioned issues, and an object thereof is to provide a display device in which the narrowed frame is achieved while the resolution is maintained.

In one general aspect, the instant application describes a display device which includes an image display area that includes a plurality of pixels sectioned by a plurality of scanning signal lines and a plurality of video signal lines, a plurality of first scanning connection lines connected to the plurality of scanning signal lines, a plurality of first thin film transistors that are interposed between the scanning signal lines and the first scanning connection lines, each of the scanning signal lines and each of the first scanning connection lines being connected to a source electrode and a drain electrode of a corresponding one of the first thin film transistors, the plurality of first thin film transistors including a first group of first thin film transistors and a second group of first thin film transistors, a plurality of first selection signal lines. One of the plurality of first selection signal lines is connected to a gate electrode of each of the first thin film transistors of the first group of first thin film transistors, each of the first thin film transistors of the first group of the first thin film transistors being connected to a different one of the first scanning connection lines, a plurality of second scanning connection lines connected to the plurality of scanning signal lines, a plurality of second thin film transistors that are interposed between the scanning signal lines and the second scanning connection lines, each of the scanning signal lines and each of the second scanning connection lines being connected to a source electrode and a drain electrode of a corresponding one of the second thin film transistors, the plurality of second thin film transistors including a third group of second thin film transistors and a fourth group of second thin film transistors, a plurality of second selection signal lines. One of the plurality of second selection signal lines is connected to a gate electrode of each of the second thin film transistors of the third group of second thin film transistors, the third group of second thin film transistors, which correspond to the first group of first thin film transistors that are connected to the one of the plurality of first selection signal lines, being connected to the one of the plurality of second selection signal lines and a scanning signal drive circuit connected to the first scanning connection lines, the first selection signal lines, and the second selection signal lines. The scanning signal drive circuit sequentially supplies a pulse signal to the first scanning connection lines in a selection period in which a gate-on voltage is applied to the one of the plurality of first selection signal lines. The scanning signal drive circuit applies a gate-off voltage to the one of the plurality of second selection signal lines corresponding to the one of the plurality of first selection signal lines to which the gate-on voltage is applied.

In another general aspect, the display device of the instant application includes an image display area that includes a plurality of pixels sectioned by a plurality of scanning signal lines and a plurality of video signal lines, a plurality of first scanning connection lines connected to the plurality of scanning signal lines, a plurality of first thin film transistors that are interposed between the scanning signal lines and the first scanning connection lines, each of the scanning signal lines and each of the first scanning connection lines being connected to a source electrode and a drain electrode of a corresponding one of the first thin film transistors, the plurality of first thin film transistors including a first group of first thin film transistors and a second group of first thin film transistors, a plurality of first selection signal lines. One of the plurality of first selection signal lines is connected to a gate electrode of each of the first thin film transistors of the first group of first thin film transistors, each of the first thin film transistors of the first group of the first thin film transistors being connected to a different one of the first scanning connection lines, at least one second scanning connection line connected to each of the plurality of scanning signal lines, a plurality of second thin film transistors that are interposed between the scanning signal lines and the second scanning connection line, each of the scanning signal lines and the second scanning connection line being connected to a source electrode and a drain electrode of a corresponding one of the second thin film transistors, the plurality of second thin film transistors including a third group of second thin film transistors and a fourth group of second thin film transistors, a plurality of second selection signal lines, wherein one of the plurality of second selection signal lines is connected to a gate electrode of each of the second thin film transistors of the third group of second thin film transistors, the third group of second thin film transistors, which correspond to the first group of first thin film transistors that are connected to the one of the plurality of first selection signal lines, being connected to the one of the plurality of second selection signal lines, and a scanning signal drive circuit connected to the first scanning connection lines, the first selection signal lines, and the second selection signal lines. The scanning signal drive circuit sequentially supplies a pulse signal to the first scanning connection lines in a selection period in which a gate-on voltage is applied to the one of the plurality of first selection signal lines, and the scanning signal drive circuit applies a gate-off voltage to the one of the plurality of second selection signal lines corresponding to the one of the plurality of first selection signal lines to which the gate-on voltage is applied.

In another general aspect, the display device of the instant application includes an image display area that includes a plurality of pixels sectioned by a plurality of scanning signal lines and a plurality of video signal lines, a plurality of scanning connection lines connected to the plurality of scanning signal lines, a plurality of thin film transistors that are interposed between the scanning signal lines and the scanning connection lines, each of the scanning signal lines and each of the scanning connection lines being connected to a source electrode and a drain electrode of a corresponding one of the thin film transistors, the plurality of thin film transistors including a first group of thin film transistors and a second group of thin film transistors, a plurality of selection signal lines, wherein one of the plurality of selection signal lines is connected to a gate electrode of each of the thin film transistors of the first group of thin film transistors, each of the thin film transistors of the first group of thin film transistors being connected to a different one of the scanning connection lines, and a scanning signal drive circuit connected to the scanning connection lines and the selection signal lines. A number of scanning connection lines is larger than a number of thin film transistors connected to the one of the plurality of selection signal lines.

In another general aspect, the display device of the instant application which includes an image display area that includes a plurality of pixels sectioned by a plurality of scanning signal lines and a plurality of video signal lines, a plurality of scanning connection lines connected to the plurality of scanning signal lines, a plurality of thin film transistors that are interposed between the scanning signal lines and the scanning connection lines, each of the scanning signal lines and each of the scanning connection lines being connected to a source electrode and a drain electrode of a corresponding one of the thin film transistors, the plurality of thin film transistors including a first group of thin film transistors and a second group of thin film transistors, a plurality of selection signal lines, wherein one of the plurality of selection signal lines is connected to a gate electrode of each of the thin film transistors of the first group of thin film transistors, each of the thin film transistors of the first group of thin film transistors being connected to a different one of the scanning connection lines, and a scanning signal drive circuit that is connected to the scanning connection lines and the selection signal lines. The scanning connection lines, the thin film transistors, and the selection signal lines are provided on each side of the scanning signal lines.

In another general aspect, the display device of the instant application includes an image display area that includes a plurality of pixels sectioned by a plurality of scanning signal lines and a plurality of video signal lines, a plurality of scanning connection lines connected to the plurality of scanning signal lines, a plurality of switching elements that are interposed between the scanning signal lines and the scanning connection lines, each of the switching elements short-circuiting each of the scanning signal lines and each of the scanning connection lines in response to a selection signal, the plurality of switching elements including a first group of switching elements and a second group of switching elements, a plurality of selection signal lines that transmit the selection signal to the switching elements, each of the plurality of switching elements of the first group of switching elements being connected to a different one of the scanning connection lines, and a scanning signal drive circuit that is connected to the scanning connection lines and the selection signal lines. The scanning connection lines, the switching elements, and the selection signal lines are provided on each side of the scanning signal lines. The switching elements include a plurality of first thin film transistors in each of which a source electrode and a drain electrode are connected to a corresponding one of the scanning signal lines and a corresponding one of the scanning connection lines while a gate electrode is connected to a corresponding one of the selection signal lines, and a plurality of second thin film transistors in each of which a source electrode and a drain electrode are connected to a corresponding one of the scanning signal lines and a corresponding one of the selection signal lines while a gate electrode is connected to a corresponding one of the scanning connection lines.

In the present disclosure, the narrowed frame can be achieved while the resolution is maintained.

BRIEF DESCRIPTION OF DRAWINGS

FIG. 8B illustrates a truth table of the switching elements.

FIG. 9A is a circuit diagram illustrating signals applied to the scanning connection lines and selection signal lines.

FIG. 9B is a circuit diagram illustrating signals applied to the scanning connection lines and selection signal lines.

FIG. 10B is a truth table of the switching elements.

DETAILED DESCRIPTION OF THE PREFERRED EMBODIMENT

Hereinafter, an exemplary embodiment of the present disclosure will be described with reference to the drawings.

Figure 1:
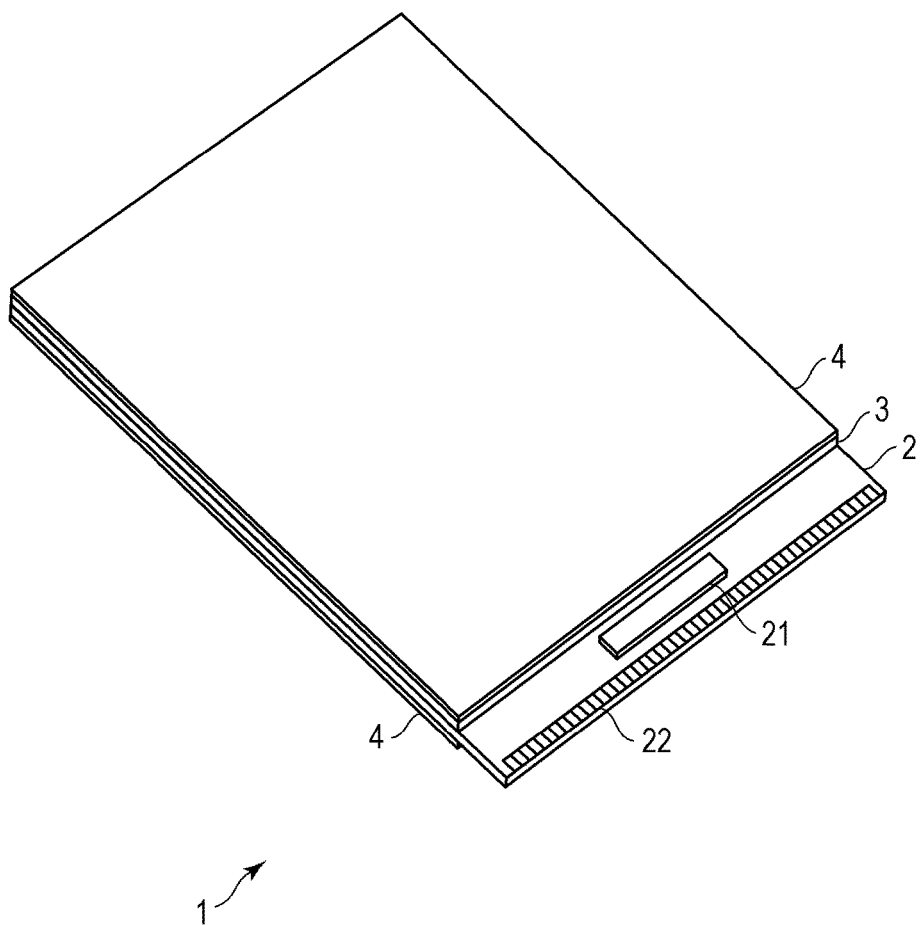
FIG. 1 is a perspective view illustrating an appearance of a liquid crystal display device according to an exemplary embodiment of the present disclosure.

FIG. 1 is a perspective view illustrating an appearance of a liquid crystal display device 1 according to the exemplary embodiment of the present disclosure. The liquid crystal display device 1 has a structure in which a liquid crystal material having a thickness of about several micrometers is sandwiched between an array substrate 2 and a color filter substrate 3. In the liquid crystal display device 1, a sealing material provided along an outer periphery of the color filter substrate 3 bonds the array substrate 2 and the color filter substrate 3 together to seal the liquid crystal material without leakage.

The array substrate 2 is a glass substrate including, on a front surface thereof, a large number of switching elements and pixel electrodes formed into a lattice shape. The array substrate 2 is also called a TFT substrate in the case where a thin film transistor (TFT) is used as a switching element. As illustrated in FIG. 1, an external form of the array substrate 2 is larger than that of the color filter substrate 3, and at least one of the edges of the array substrate 2 is extended out from the color filter substrate 3, thereby exposing the front surface of the array substrate 2. On the exposed portion in the front surface of the array substrate 2, a driver IC 21 is mounted which serves as a control circuit configured to control on and off of the large number of switching elements and a video signal to be applied to each pixel electrode. A connection terminal 22 is formed on the exposed portion in the front surface of the array substrate 2 in order to electrically connect the liquid crystal display device 1 to an external device using, for example, a flexible printed circuit.

The color filter substrate 3 is a glass substrate including thin films colored with red, green, and blue for pixels, which serve as units for the liquid crystal display device 1 to form an image. The colored thin films are provided at positions corresponding to the pixel electrodes formed on the array substrate 2.

Polarizing films 4 are bonded to a rear surface of the array substrate 2 and a front surface of the color filter substrate 3.

Note that, in the exemplary embodiment, the liquid crystal display device 1 is what is called a transmissive liquid crystal display device, and the array substrate 2 and the color filter substrate 3 are formed of transparent substrates such as glass and the like. In the case where the liquid crystal display device 1 is a reflective liquid crystal display device, the array substrate 2 and the color filter substrate 3 are not necessarily transparent, and the materials for the array substrate 2 and color filter substrate 3 are not limited to glass. Further, in the exemplary embodiment, because the liquid crystal display device 1 can perform full color display, the thin films colored with red, green, and blue are provided in the color filter substrate 3. However, the combination of the colors may differ. For the purpose of a monochromatic display of the liquid crystal display device 1, the thin film colored with a single color may be used or eliminated.

Figure 2:
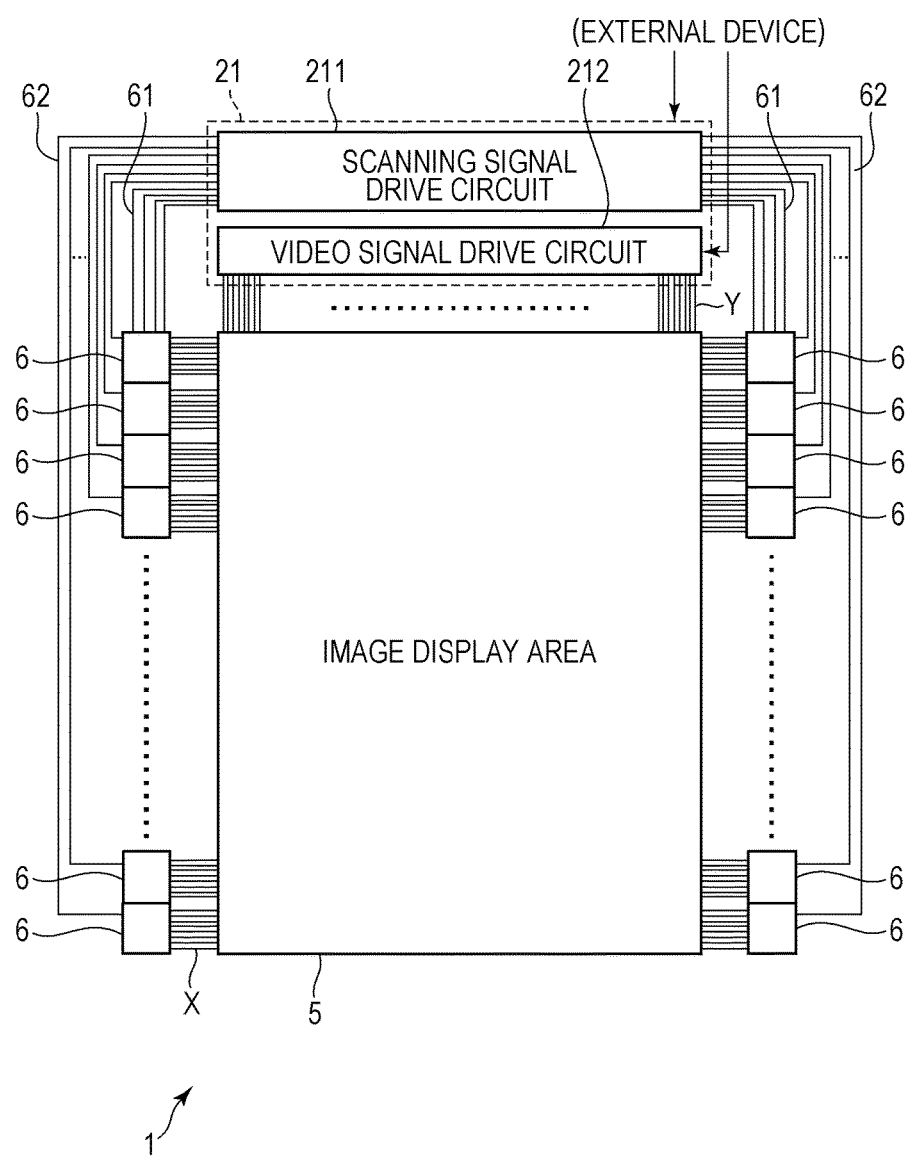
FIG. 2 is a view illustrating a configuration of a circuit formed on an array substrate.

FIG. 2 is a view illustrating a configuration of a circuit formed on the array substrate 2.

A rectangular image display area 5 where a large number of pixels are arrayed into a lattice shape is formed on the array substrate 2. Resolution or lengths in horizontal and vertical directions of the image display area 5 are fixed according to an application of the liquid crystal display device 1. The liquid crystal display device 1 exemplified in the exemplary embodiment has a vertically long shape (a horizontal length is shorter than a vertical length). This is because the liquid crystal display device 1 is aimed at a display device for a mobile information terminal such as a smartphone. Depending on the application, the image display area 5 may be horizontally long (the horizontal length is longer than the vertical length), or the horizontal length may be equal to the vertical length.

A plurality of scanning signal lines X and a plurality of video signal lines Y are formed on the array substrate 2 so as to go through the image display area 5. The scanning signal lines X and the video signal lines Y are orthogonal to each other, and section the image display area 5 into lattice shapes. One pixel corresponds to an area surrounded by two adjacent scanning signal lines X and two adjacent video signal lines Y.

Figure 3:
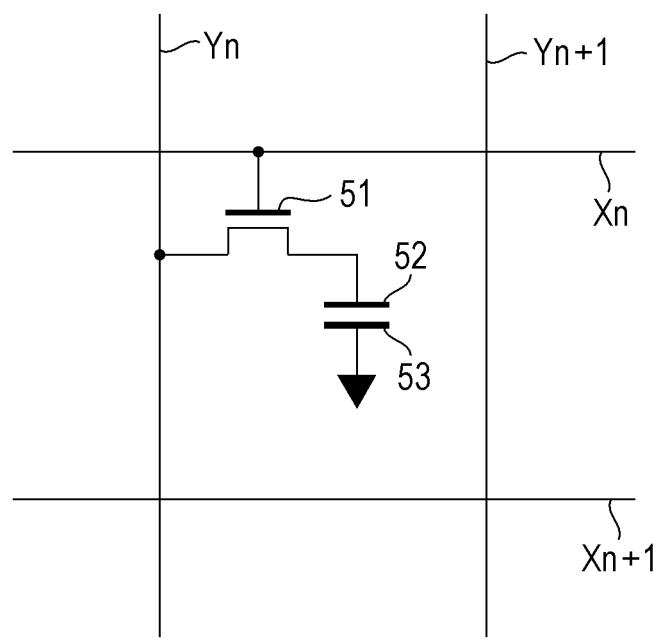
FIG. 3 is a circuit diagram illustrating one pixel formed in an image display area.

FIG. 3 is a circuit diagram illustrating one pixel formed in an image display area 5. In FIG. 3, one pixel corresponds to the area surrounded by scanning signal lines Xn and Xn+1 and video signal lines Yn and Yn+1. The pixel referred to here is driven by the video signal line Yn and the scanning signal line Xn. A TFT 51 is provided in each pixel. The TFT 51 is put into an on state by a scanning signal input from the scanning signal line Xn. The video signal line Yn applies a voltage (a signal representing a grayscale value of each pixel) to a pixel electrode 52 of the corresponding pixel through the TFT 51 in the on state.

A common electrode 53 is formed so as to correspond to the pixel electrode 52 such that capacitance is formed through the liquid crystal layer sandwiched and sealed between the array substrate 2 and the color filter substrate 3. The common electrode 53 is electrically connected to a common potential. Therefore, an electric field between the pixel electrode 52 and the common electrode 53 changes according to the voltage applied to the pixel electrode 52, thereby changing the alignment state of the liquid crystal in the liquid crystal layer. In this manner, a polarization state of a light beam that transmits through the image display area 5 is controlled. A transmittance of the light beam that transmits through the liquid crystal display device 1 is determined based on a relationship between a polarization direction to be controlled by the liquid crystal layer and polarization directions of the polarizing films 4 bonded to the array substrate 2 and the color filter substrate 3, and each pixel functions as an element for controlling the transmittance of the light beam. The transmittance of the light beam is controlled in each pixel according to input image data, thereby displaying the image. Accordingly, in the liquid crystal display device 1, the area where the pixels are formed corresponds to the image display area 5 where the image is displayed.

Note that, a substrate on which the common electrode 53 is formed varies according to a liquid crystal driving system. For example, the common electrode is formed in the array substrate 2 in the case of a system called in-plane switching (IPS), and the common electrode is formed in the color filter substrate 3 in the case of a system called vertical alignment (VA) or twisted nematic (TN). In the present disclosure, although the liquid crystal driving system is not particularly limited, the IPS system is used in the exemplary embodiment.

Referring back to FIG. 2, the driver IC 21 including a scanning signal drive circuit 211 and a video signal drive circuit 212 is provided on at least one of the sides of the edges parallel to the scanning signal lines X of the image display area 5, namely, on the upper side of the image display area in the example of FIG. 2. A power supply voltage, a ground voltage, and various signals such as a timing signal and the video signal are input to the driver IC 21 from the external device. Each of the scanning signal drive circuit 211 and the video signal drive circuit 212 may be configured as an individual driver IC.

The scanning signal drive circuit 211 is connected to the scanning signal lines X through selection circuits 6 by a plurality of scanning connection lines 61. The appropriate number of selection signal lines 62 are extended from the scanning signal drive circuit 211 to be connected to the selection circuits 6. The scanning signal drive circuit 211 sequentially selects the scanning connection lines 61 at a timing corresponding to the timing signal input from the external device, and applies a voltage for turning on the TFT 51 (see FIG. 3) (hereinafter, referred to as an on voltage or a high-level voltage) to the selected scanning connection line 61. The on voltage applied to the scanning connection line 61 is a scanning signal. Similarly, the scanning signal drive circuit 211 sequentially selects the selection signal lines 62 at the timing corresponding to the timing signal input from the external device, and applies the on voltage to the selected selection signal line 62. The on voltage applied to the selection signal line 62 is a selection signal to be described later. Each of the selection circuits 6 sequentially applies the on voltage to the scanning signal lines X based on the on voltage applied to the scanning connection line 61 and the selection signal line 62. When the on voltage is applied to the scanning signal line X, the TFT 51 connected to the scanning signal line X becomes the on state.

The scanning connection lines 61, the selection signal lines 62, and the selection circuits 6 are provided on both sides of the edges (in the example of FIG. 2, horizontal edges) parallel to the video signal lines Y of the image display area 5. That is, the scanning connection lines 61 provided on the left side are connected to a left end of each of the scanning signal lines X through each of switching elements 63, each of the scanning connection lines 61 provided on the right side is connected to a right end of each of the scanning signal lines X through each of the switching elements 63, and the on voltage can be input from both the right and left sides. Therefore, the selection circuits 6 can selectively be used such that one of the selection circuits 6 provided on both the right and left sides is used to input the on voltage, while the other pauses. The selection signal lines 62 are temporally extended from the scanning signal drive circuit 211 to the horizontally outside areas of the image display area 5, pass through the outsides of the right and left edges of the image display area 5 in parallel to the video signal line Y, and are disposed so as to be connected to the selection circuits 6. The selection circuits 6 are arrayed, in parallel to the video signal lines Y, between the selection signal lines 62 and the image display area 5.

The video signal drive circuit 212 is connected to the video signal lines Y. In accordance with the scanning signal line X selected by the scanning signal drive circuit 211 and the selection circuit 6, the video signal drive circuit 212 applies the voltage to each of the TFTs 51 connected to the selected scanning signal line X in response to the video signal representing the grayscale value of each pixel.

In the configuration including the scanning connection lines 61, the selection signal lines 62, and the selection circuits 6, the number of signal lines to be disposed in the areas on the outsides in the horizontal direction of the image display area 5, namely, the total number of scanning connection lines 61 and selection signal lines 62 are largely decreased. Therefore, the narrowed frame of the liquid crystal display device 1 is achieved because of the reduced width necessary for the areas on the outsides in the horizontal direction of the image display area 5.

A relationship among the scanning connection lines 61, the selection signal lines 62, and the selection circuits 6 will specifically be described below.

Figure 4:
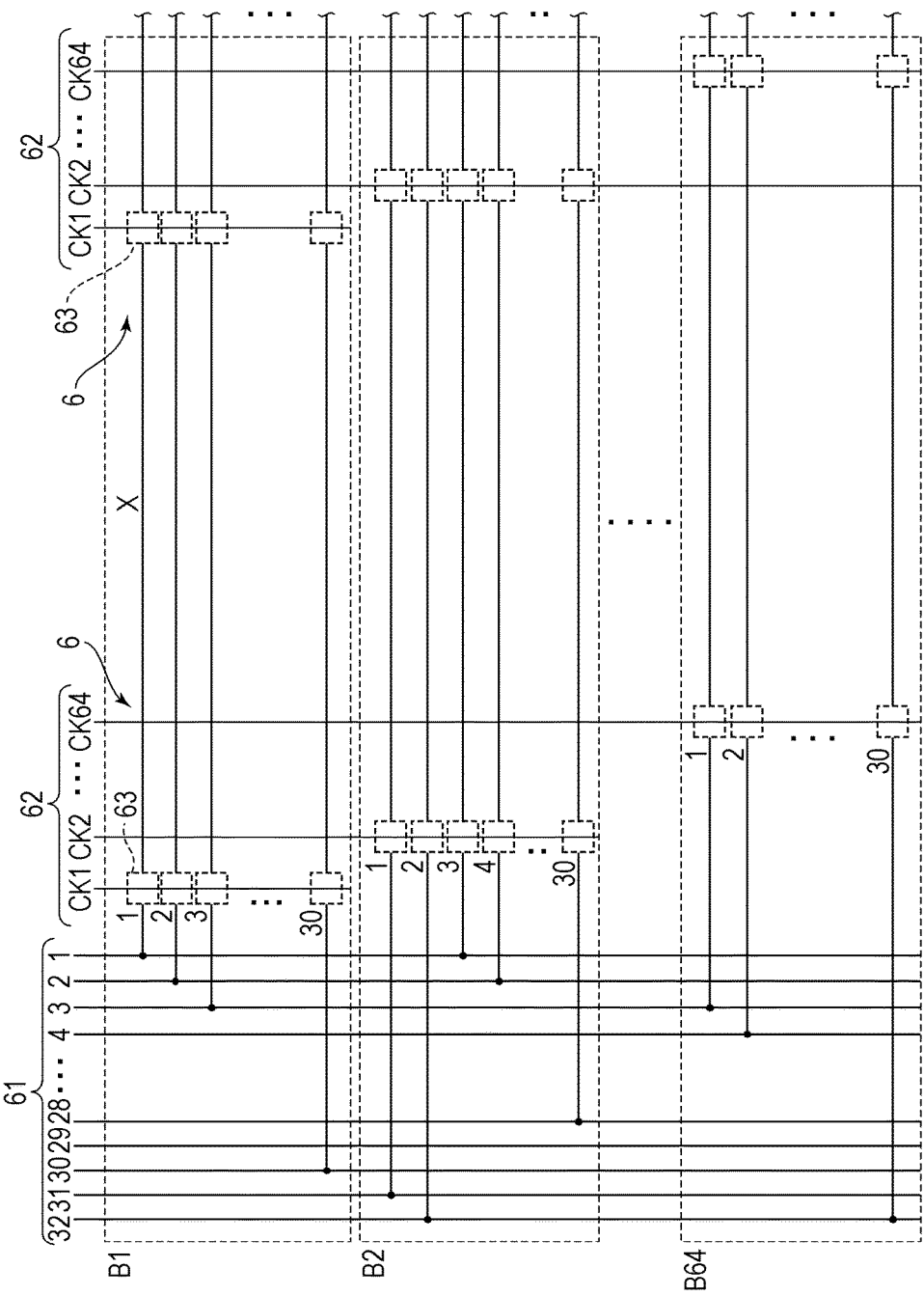
FIG. 4 is a circuit diagram illustrating the relationship among scanning connection lines, selection signal lines, and selection circuits.

FIG. 4 is a circuit diagram illustrating the relationship among the scanning connection lines 61, the selection signal lines 62, and the selection circuits 6. The scanning connection lines 61 on the right side are omitted in FIG. 4. The plurality of scanning connection lines 61 are led into the selection circuits 6 while branched, and the plurality of scanning connection lines 61 are connected to the scanning signal lines X through the switching elements 63 formed of the TFTs. The switching elements 63 connected to the scanning connection lines 61 are commonly connected to one of the plurality of selection signal lines 62. The scanning signal drive circuit 211 sequentially outputs a pulse signal as the scanning signal to the scanning connection lines 61 in a selection period in which the on voltage as one selection signal is applied to one of the selection signal lines 62.

In the exemplary embodiment, the number of scanning connection lines 61 is larger than the number of switching elements 63 connected to one selection signal line 62 by at least one. In the example of FIG. 4, for 32 lines of scanning connection lines 61, 30 pieces of switching elements 63 are connected to the one selection signal line 62, and the number of scanning connection lines 61 is larger than the number of switching elements 63 connected to the one selection signal line 62 by two.

In the example of FIG. 4, 1920 lines of scanning signal lines X are provided, each 32 lines of the scanning connection lines 61 are provided on the right and left sides, and each 64 lines of the selection signal lines 62 are provided on the right and left sides. Each 64 pieces of the selection circuits 6 are provided, as many as the selection signal lines 62, on the right and left sides. In each selection circuit 6, 30 pieces of switching elements 63 connected to the scanning connection lines 61 different from one another are connected to the one selection signal line 62. Numbers 1 to 32 of the scanning connection lines 61 indicate an order to transmit the pulse signal. Numbers CK1 to CK64 of the selection signal lines 62 indicate an order to transmit the selection signal.

The configurations of the scanning connection lines 61, the selection signal lines 62, and the selection circuits 6 will specifically be described below. The scanning connection lines 61 having the numbers 1 to 30 are led into B1 of the selection circuit 6 located at the highest position, and connected to the scanning signal lines X through the switching elements 63 having the numbers 1 to 30 connected to the selection signal line 62 having the number CK1. On the other hand, the scanning connection lines 61 having numbers 31 and 32 are not led into B1 of the selection circuit 6, and not connected to the switching elements 63 having numbers 1 to 30 connected to the selection signal line 62 having the number CK1. The scanning connection lines 61 having numbers 1 and 2 are connected to the leading switching elements 63 having numbers 1 and 2 in the switching elements 63 having the numbers 1 to 30 connected to the selection signal line 62 having the number CK1 in B1 of the selection circuit 6.

The scanning connection lines 61 having the numbers 31, 32 and 1 to 28 are led into B2 of the selection circuit 6 located at the second highest position, and connected to the scanning signal lines X through the switching elements 63 having the numbers 1 to 30 connected to the selection signal line 62 having the number CK2. On the other hand, the scanning connection lines 61 having the numbers 29 and 30 are not led into B2 of the selection circuit 6, and not connected to the switching elements 63 having the numbers 1 to 30 connected to the selection signal line 62 having the number CK2. The scanning connection lines 61 having the numbers 31 and 32 are connected to the leading switching elements 63 having the numbers 1 and 2 in the switching elements 63 having the numbers 1 to 30 connected to the selection signal line 62 having the number CK2 in B2 of the selection circuit 6.

Thereafter, the similar operation is repeated up to B64 of the selection circuit 6 located at the 64th position from the top. The scanning connection lines 61 having the numbers 3 to 32 are led into B64 of the selection circuit 6 located at the 64th position from the top, and connected to the scanning signal lines X through the switching elements 63 having the numbers 1 to 30 connected to the selection signal line 62 having the number CK64. On the other hand, the scanning connection lines 61 having the numbers 1 and 2 are not led into B64 of the selection circuit 6, and not connected to the switching elements 63 having the numbers 1 to 30 connected to the selection signal line 62 having the number CK64. The scanning connection lines 61 having the numbers 3 and 4 are connected to the leading switching elements 63 having the numbers 1 and 2 in the switching elements 63 having the numbers 1 to 30 connected to the selection signal line 62 having the number CK64 in B64 of the selection circuit 6. The same holds true for the selection circuits 6 provided on the right edge of the image display area 5.

The numbers of scanning connection lines 61, selection signal lines 62, switching elements 63, and selection circuits 6 are not limited to those in the exemplary embodiment. For 1600 scanning signal lines X, for example, each 32 lines of the scanning connection lines 61 are provided on the right and left sides, each 64 lines of the selection signal lines 62 are provided on the right and left sides, and 25 pieces of switching elements 63 are connected to the one selection signal line 62. In this case, the number of scanning connection lines 61 is larger than the number of switching elements 63 connected to the one selection signal line 62 by seven. For 1280 lines of scanning signal lines X, for example, each 22 lines of the scanning connection lines 61 are provided on the right and left sides, each 64 lines of the selection signal lines 62 are provided on the right and left sides, and 20 pieces of switching elements 63 are connected to the one selection signal line 62. In this case, the number of scanning connection lines 61 is larger than the number of switching elements 63 connected to the one selection signal line 62 by 2. For 2560 scanning signal lines X, for example, each 42 lines of the scanning connection lines 61 are provided on the right and left sides, each 64 lines of the selection signal lines 62 are provided on the right and left sides, and 40 pieces of switching elements 63 are connected to the one selection signal line 62. In this case, the number of scanning connection lines 61 is larger than the number of switching elements 63 connected to the one selection signal line 62 by two.

The operation of the scanning signal drive circuit 211 will specifically be described. The scanning signal drive circuit 211 applies the on voltage to the selection signal line 62 having the number CK1 to turn on all the switching elements 63 having the numbers 1 to 30, which are connected to the selection signal line 62 having the number CK1 and included in B1 of the selection circuit 6 located at the highest position from the top, and sequentially outputs the pulse signal to the scanning connection lines 61 having the numbers 1 to 30 in a period during which the on voltage is applied to the selection signal line 62 having the number CK1. Hereinafter, the period during which the on voltage is applied to the selection signal line 62 having the number CK1 is referred to as a first selection period. Turning on all the switching elements 63 having the numbers 1 to 30, which are connected to the selection signal line 62 having the number CK1 and included in B1 of the selection circuit 6, is referred to as putting B1 of the selection circuit 6 into an active state. For example, the pulse signal is a square waveform signal, which rises from a low-level voltage to a high-level voltage and falls from the high-level voltage to the low-level voltage after a certain period.

Then, the scanning signal drive circuit 211 applies the on voltage to the selection signal line 62 having the number CK2 to turn on all the switching elements 63 having the numbers 1 to 30, which are connected to the selection signal line 62 having the number CK2 and included in B2 of the selection circuit 6 located at the second highest position from the top, and the scanning signal drive circuit 211 sequentially outputs the pulse signal to the scanning connection lines 61 having the numbers 31, 32, and 1 to 28 in a period during which the on voltage is applied to the selection signal line 62 having the number CK2. Thereafter, the similar operation is repeated up to B64 of the selection circuit 6 located at the 64th position from the top. Finally, the scanning signal drive circuit 211 applies the on voltage to the selection signal line 62 having the number CK64 to turn on all the switching elements 63 having the numbers 1 to 30, which are connected to the selection signal line 62 having the number CK64 and included in B64 of the selection circuit 6 located at the 64th position from the top, and the scanning signal drive circuit 211 sequentially outputs the pulse signal to the scanning connection lines 61 having the numbers 3 to 32 in a period during which the on voltage is applied to the selection signal line 62 having the number CK64. As described later, the scanning signal drive circuit 211 partially overlaps two selection periods having a back-and-forth relationship.

Figure 5:
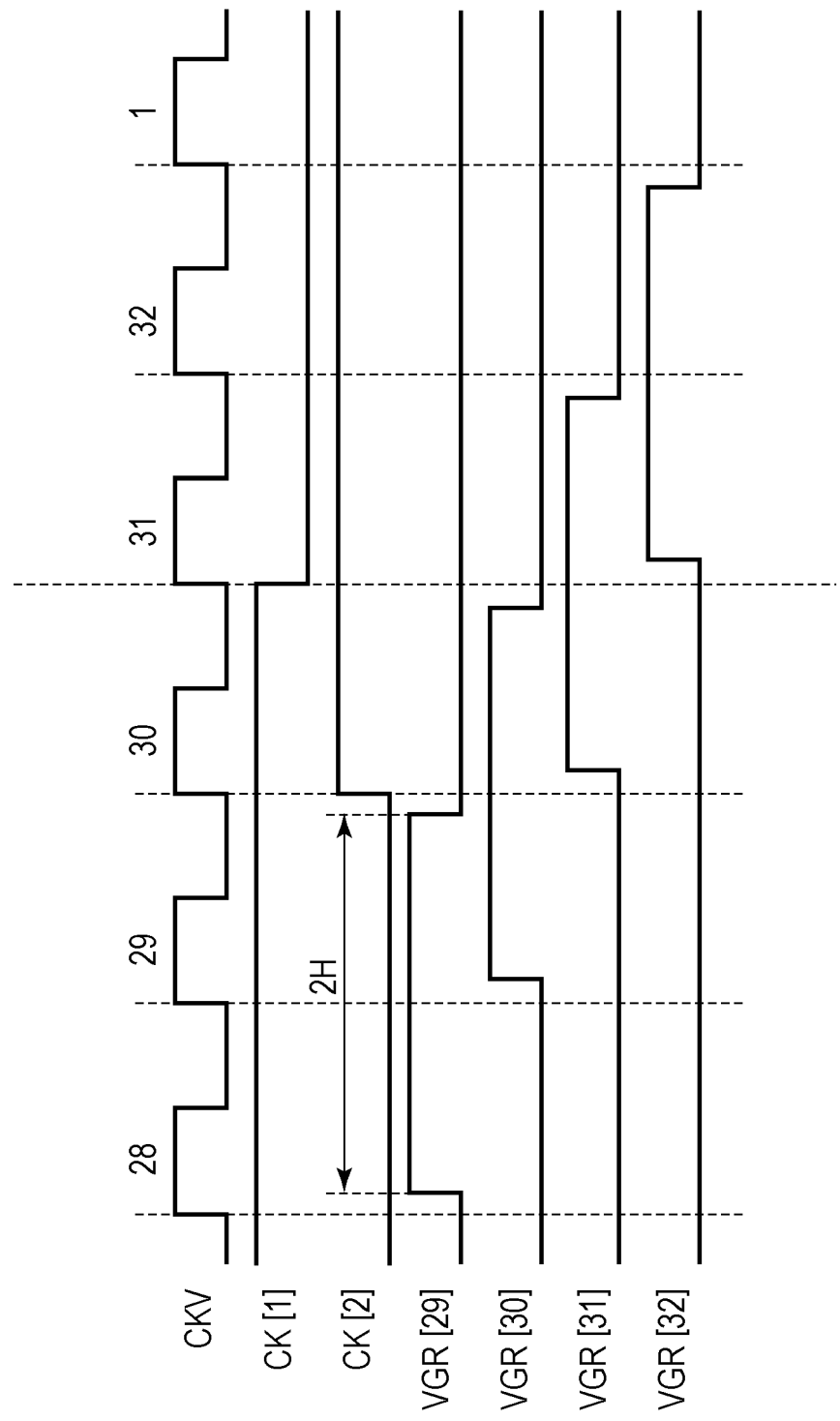
FIG. 5 is a timing chart illustrating signals applied to the scanning connection lines and selection signal lines.

FIG. 5 is a timing chart illustrating signals applied to the scanning connection lines 61 and selection signal lines 62. FIG. 5 illustrates a portion associated with a boundary between the first selection period in which the on voltage is applied to the selection signal line 62 having the number CK1 and a second selection period in which the on voltage is applied to the selection signal line 62 having the number CK2. The reference mark CKV designates a reference clock signal, the reference marks CK[1] and CK[2] designate the selection signals applied to the selection signal lines 62 having the numbers CK1 and CK2 in FIG. 4, and the reference marks VGR [29] to VGR [32] designate the pulse signals applied to the scanning connection lines 61 having the numbers 29 to 32 in FIG. 4.

In the exemplary embodiment, the scanning signal drive circuit 211 temporally overlaps the preceding pulse signal and the next pulse signal with each other such that the next pulse signal rises before the preceding pulse signal falls while making a time width of each of the pulse signals sequentially output to scanning connection lines 61 having the numbers 1 to 32 longer than one horizontal scanning period (1H). For example, the pulse signal has the time width of about 2H. The scanning signal drive circuit 211 makes rise timing of the pulse signal output to the scanning connection line 61 earlier than supply start timing at which the video signal voltage corresponding to the pixel value is supplied from the video signal line Y to the TFT 51 (see FIG. 3) in the pixel corresponding to the scanning connection line 61. Therefore, a pixel charging time can be ensured even if the one horizontal scanning period (1H) is shortened in association with the high resolution of the image display area 5. Particularly, in the case where the switching element 63 formed of the TFT is used as in the exemplary embodiment, because the waveform of the pulse signal for driving the TFT 51 of the image display area 5 easily becomes dull by an influence of an on resistance of the switching element 63, it is necessary to make the time width of the pulse signal longer than the one horizontal scanning period (1H) to ensure the pixel charging time.

In the exemplary embodiment, before the one horizontal scanning period (1H) prior to the end of the first selection period in which the on voltage is applied to the selection signal line 62 having the number CK1, the scanning signal drive circuit 211 outputs the pulse signal to the scanning connection line 61 having the number 31 not connected to the switching elements 63 connected to the selection signal line 62 having the number CK1 while starting the second selection period in which the on voltage is applied to the selection signal line 62 having the number CK2. That is, the scanning signal drive circuit 211 outputs the pulse signal to the scanning connection line 61 having the number 31 while starting the second selection period in which B2 of the selection circuit 6 is put into the active state before the one horizontal scanning period (1H) prior to the end of the first selection period in which B1 of the selection circuit 6 is put into the active state. Even if the on voltage is simultaneously applied to the selection signal lines 62 having the numbers CK1 and CK2, the scanning signal line X is not influenced by inflow of the pulse signal output to the scanning connection line 61 having the number 31 into B1 of the selection circuit 6. Therefore, the pulse signal is supplied to the scanning connection line 61 having the number 31 corresponding to a head of the second selection period before the end of the first selection period, whereby the time width of the pulse signal can be made longer than the one horizontal scanning period (1H).

Specifically, in the case where the number of scanning connection lines 61 is equal to the number of switching elements 63 connected to one selection signal line 62, the pulse signal output to the one scanning connection line 61 flows into the two selection circuits 6 to have an influence on two scanning signal lines X when the on voltage is simultaneously applied to the two selection signal lines 62. Therefore, the time width of the pulse signal cannot be made longer than the one horizontal scanning period (1H) by partially overlapping the two selection periods having the back-and-forth relationship with each other. On the other hand, in the exemplary embodiment, the number of scanning connection lines 61 is larger than the number of switching elements 63 connected to the one selection signal line 62, so that the time width of the pulse signal can be made longer than the one horizontal scanning period (1H) by partially overlapping the two selection periods having the back-and-forth relationship with each other.

An example in which a counter-stress is applied to the switching element 63 formed of the TFT will be described below.

Each of the switching elements 63 included in the selection circuit 6 has a use frequency higher than that of the TFT 51 (see FIG. 3) in the pixel. Therefore, for example, in the case where the switching element 63 is formed of the amorphous silicon TFT, amorphous silicon in the switching element 63 is degraded in association with accumulation of a use period (a display period in which an image is displayed in the image display area 5) of the liquid crystal display device 1, and possibly a threshold voltage of the switching element 63 increases gradually.

For this reason, in the following example, by applying the counter-stress to the switching element 63 included in the selection circuit 6, the increase in threshold voltage of the switching element 63 is suppressed to lengthen a lifetime of the liquid crystal display device 1.

As used herein, applying the counter-stress to the switching element 63 means that a low-level voltage (for example, −6 V) is applied to the selection signal line 62 connected to a gate electrode of the switching element 63 while a high-level voltage (for example, 18 V) is applied to the scanning connection line 61 connected to a source electrode or a drain electrode of the switching element 63.

Figure 6A:
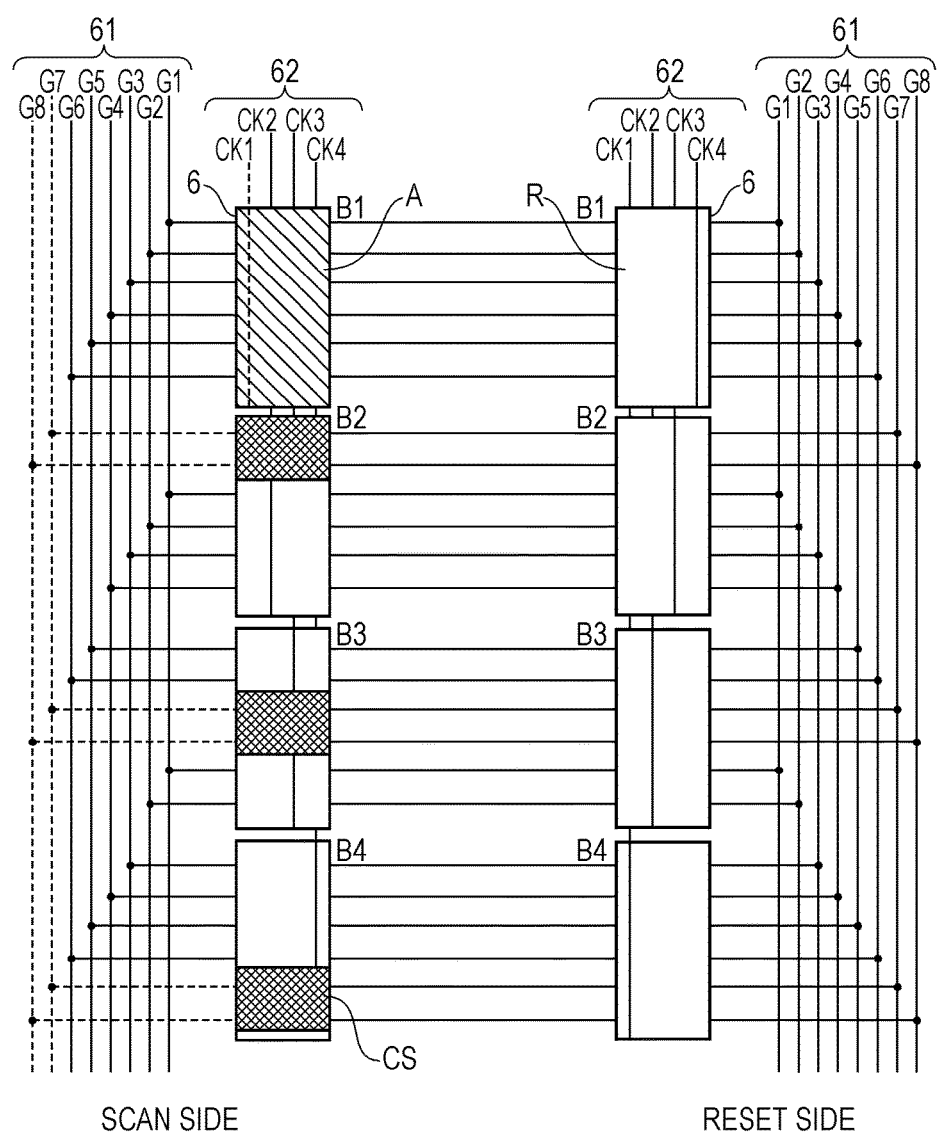
FIGS. 6A and 6B are circuit diagrams illustrating the relationship among the scanning connection lines, the selection signal lines, and the selection circuits.
Figure 6B:
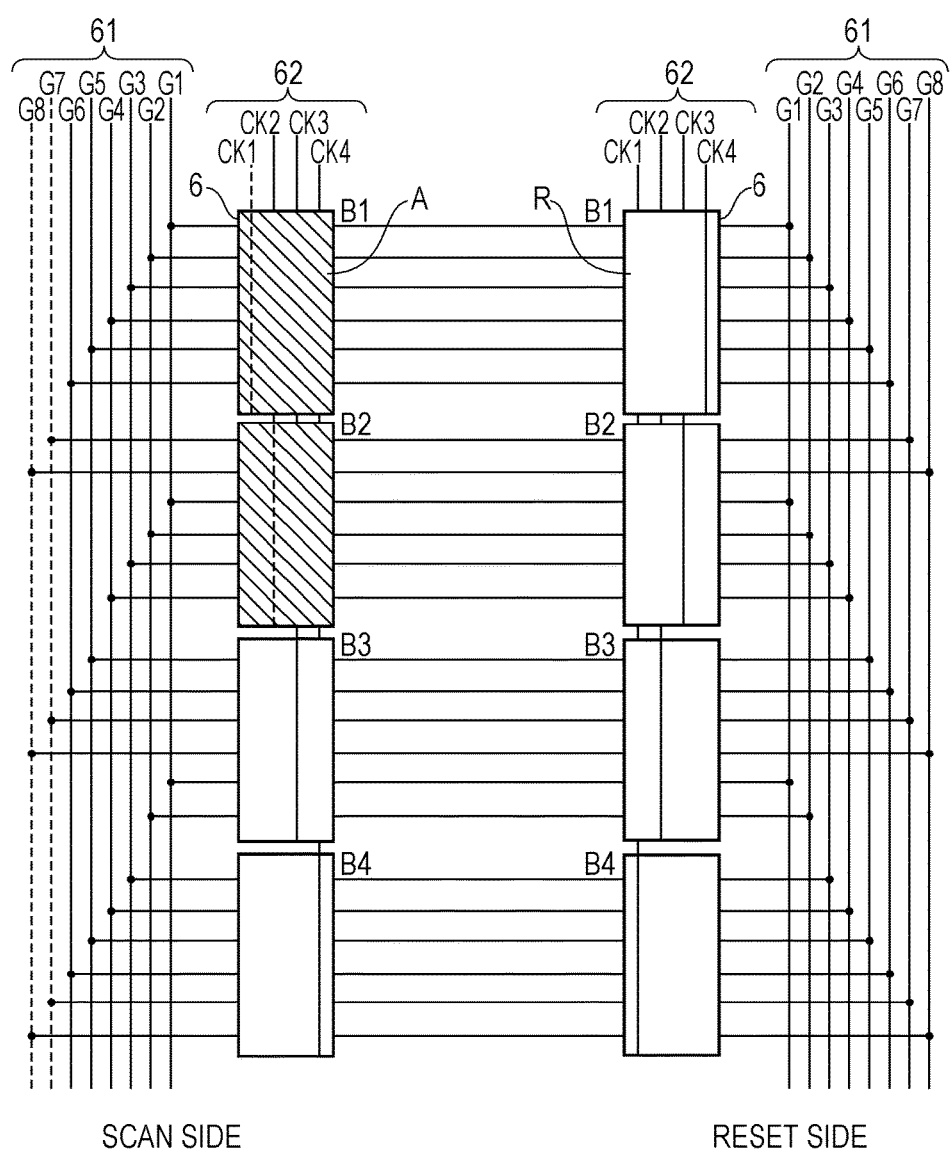

FIGS. 6A and 6B are circuit diagrams illustrating the relationship among the scanning connection lines 61, the selection signal lines 62, and the selection circuits 6. In the example in FIGS. 6A and 6B, each 8 lines of the scanning connection lines 61 are provided on the right and left sides, each 4 lines of the selection signal lines 62 are provided on the right and left sides, and each 4 pieces of the selection circuits 6 are provided on the right and left sides. The 6 lines of scanning connection lines 61 are led into each selection circuit 6. In the example in FIGS. 6A and 6B, the line to which the high-level voltage is applied is indicated by a broken line (excluding the line to which the pulse signal is applied) in the scanning connection lines 61 having the numbers G1 to G8 and the selection signal lines 62 having the numbers CK1 to CK4.

In sets of the scanning connection lines 61, selection signal lines 62, and selection circuits 6, which are provided on the right and left sides, the scanning signal drive circuit 211 performs a usual scan mode in which the scanning signal line X is scanned in one of the sets, performs a reset mode in which the scanning signal line X is not scanned in the other sets, and switches the usual scan mode and the reset mode in each certain period (for example, about 0.1 second to several seconds). In the example in FIGS. 6A and 6B, the usual scan mode is performed on the left side named a "scan side", and the reset mode is performed on the right side named a "reset side".

In the usual scan mode, as described above, the on voltage is sequentially applied to the selection signal lines 62 having the numbers CK1 to CK4, and the pulse signal is sequentially output to the scanning connection lines 61 having the numbers G1 to G8 in each period. In the reset mode, the low-level voltage is applied to all the scanning connection lines 61 having the numbers G1 to G8 and the selection signal lines 62 having the numbers CK1 to CK4. In the example of FIG. 6A, the on voltage is applied to the left-side selection signal line 62 having the number CK1 to put the left-side B1 of selection circuits 6 into the active state.

Additionally, in this example, in the plurality of selection circuits 6 on the side performing the usual scan mode, the counter-stress is applied to a part of the switching elements 63 included in the selection circuit 6 that is not in the active state.

In the example in FIGS. 6A and 6B, the selection circuit 6 that becomes the active state by applying the high-level voltage to the selection signal line 62 is hatched, and a letter "A" indicating the active state is added to the selection circuit 6 that becomes the active state. The selection circuit 6 that becomes the reset state by applying the low-level voltage to the selection signal line 62 and the scanning connection line 61 is indicated by a white blank portion, and a letter "R" indicating the reset state is added to the selection circuit 6 that becomes the reset state. In the selection circuit 6 in the reset state, a portion that becomes a counter-stress state such that the low-level voltage is applied to the selection signal line 62 while the high-level voltage is applied to the scanning connection line 61 is cross-hatched, and a letter "CS" indicating the counter-stress state is added to the portion that becomes the counter-stress state.

Specifically, as illustrated in the example of FIG. 6A, the high-level voltage is applied to the scanning connection lines 61 having the numbers G7 and G8 in the first selection period in which B1 of the selection circuit 6 becomes the active state by applying the on voltage to the selection signal line 62 having the number CK1. Therefore, in the first selection period, the counter-stress is applied to the switching elements 63 connected to the scanning connection lines 61 having the numbers G7 and G8 in B2 to B4 of the selection circuits 6 that are not in the active state.

The high-level voltage is applied to the scanning connection lines 61 having the numbers G5 and G6 in the second selection period in which B2 of the selection circuit 6 becomes the active state by applying the on voltage to the selection signal line 62 having the number CK2. Therefore, in the second selection period, the counter-stress is applied to the switching elements 63 connected to the scanning connection lines 61 having the numbers G5 and G6 in B1, B3, and B4 of the selection circuits 6 that are not in the active state.

The high-level voltage is applied to the scanning connection lines 61 having the numbers G3 and G4 in the third selection period in which B3 of the selection circuit 6 becomes the active state by applying the on voltage to the selection signal line 62 having the number CK3. Therefore, in the third selection period, the counter-stress is applied to the switching elements 63 connected to the scanning connection lines 61 having the numbers G3 and G4 in B1, B2, and B4 of the selection circuits 6 that are not in the active state.

The high-level voltage is applied to the scanning connection lines 61 having the numbers G1 and G2 in the fourth selection period in which B4 of the selection circuit 6 becomes the active state by applying the on voltage to the selection signal line 62 having the number CK4. Therefore, in the fourth selection period, the counter-stress is applied to the switching elements 63 connected to the scanning connection lines 61 having the numbers G1 and G2 in B1 to B3 of the selection circuits 6 that are not in the active state.

In this manner, the counter-stress is applied to all the switching elements 63 included in B1 to B4 of the selection circuits 6 during a cycle of the application of the on voltage to the selection signal lines 62 having the numbers CK1 to CK4.

Thus, in each selection period, the counter-stress is applied to the part of the switching elements 63 included in the selection circuits 6 that are not the active state, and thus it is possible to apply the counter-stress even in the display period in which the image is displayed in the image display area 5. Therefore, it is not necessary to separately provide a period in which the counter-stress is applied, and there is no problem of a display flicker in the period.

Figure 7:
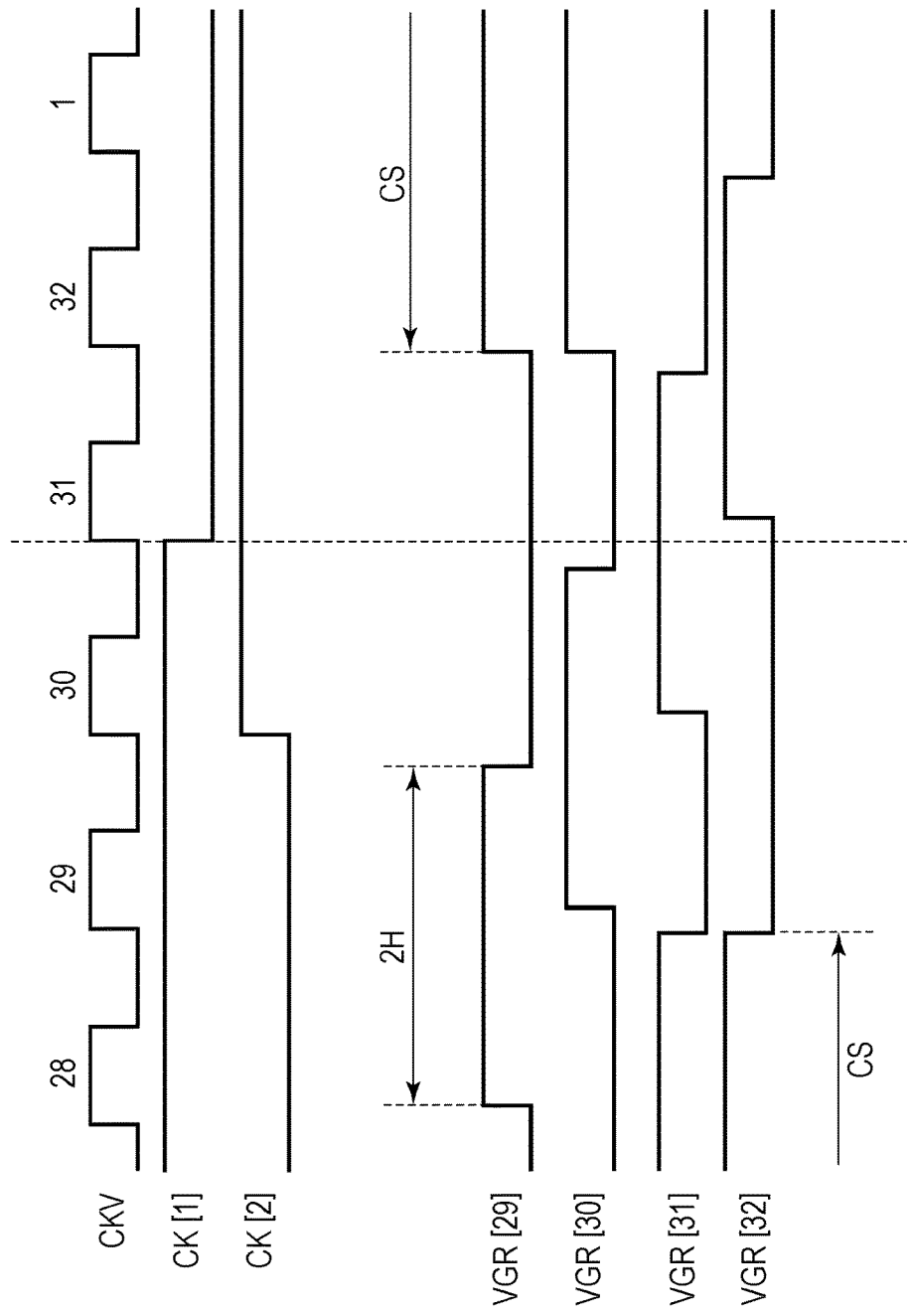
FIG. 7 is a timing chart illustrating signals applied to the scanning connection lines and selection signal lines.

FIGS. 6B and 7 illustrate a portion associated with the boundary between the first selection period in which the on voltage is applied to the selection signal line 62 having the number CK1 and the second selection period in which the on voltage is applied to the selection signal line 62 having the number CK2.

In the case where the two selection periods having the back-and-forth relationship are partially overlapped with each other, the scanning signal drive circuit 211 does not apply the counter-stress to any selection circuit 6 in the overlapping period, namely, the period in which the on voltage is simultaneously applied to the two selection signal lines 62. This is because the high-level voltage for the counter-stress is prevented from being applied to the scanning signal line X from the scanning connection line 61.

Specifically, as illustrated in FIG. 7, the scanning signal drive circuit 211 applies the high-level voltage to the scanning connection lines 61 having the numbers 31 and 32 in the first selection period for the purpose of the counter-stress, and switches the voltage applied to the scanning connection lines 61 having the numbers 31 and 32 from the high-level voltage to the low-level voltage before the one horizontal scanning period (1H) prior to the start of the second selection period, namely, the one horizontal scanning period (1H) prior to the start of the overlapping period.

As illustrated in FIG. 7, the scanning signal drive circuit 211 applies the high-level voltage to the scanning connection lines 61 having the numbers 29 and 30 in the second selection period for the purpose of the counter-stress, and switches the voltage applied to the scanning connection lines 61 having the numbers 29 and 30 from the low-level voltage to the high-level voltage after the one horizontal scanning period (1H) prior to the end of the first selection period, namely, the one horizontal scanning period (1H) prior to the end of the overlapping period.

Other examples of the reset mode will be described below.

Figure 8A:
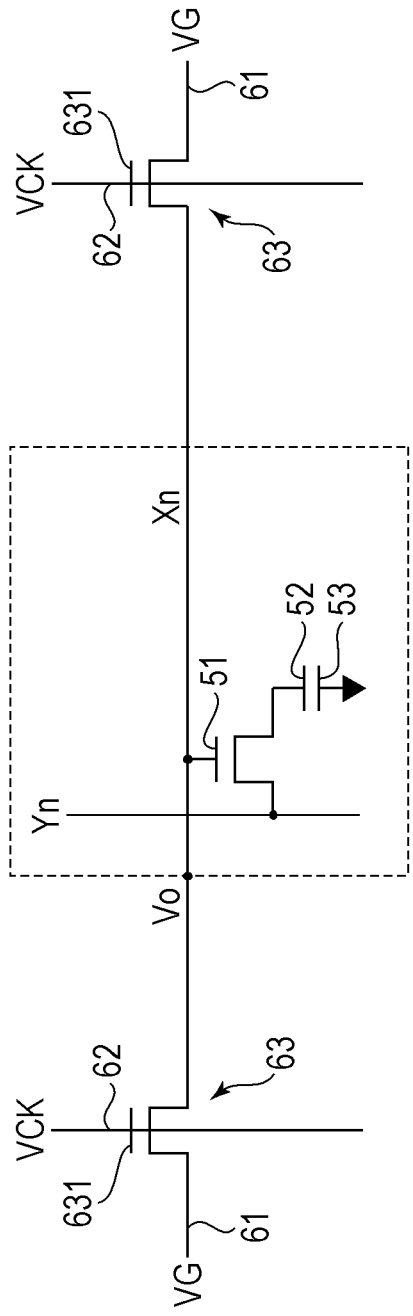
FIG. 8A is a circuit diagram illustrating the relationship among scanning connection lines, selection signal lines, and the switching elements.
Figure 8B:
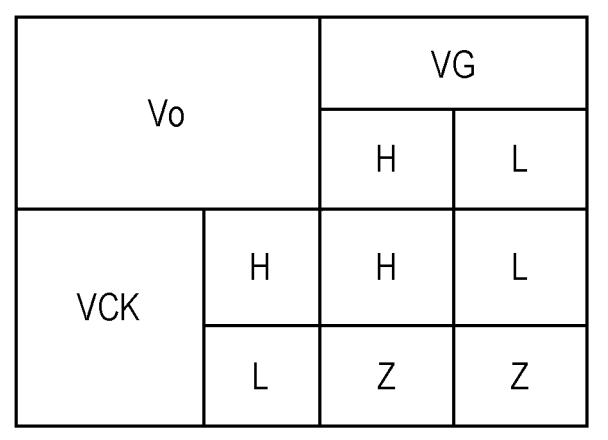

FIG. 8A is a circuit diagram illustrating the relationship among the scanning connection lines 61, the selection signal lines 62, and the switching elements 63. FIG. 8B illustrates a truth table of the switching element 63. FIG. 8A illustrates the scanning connection lines 61, selection signal lines 62, and switching elements 63, which are connected to both ends of one scanning signal line Xn.

In this example, each of the switching elements 63 is formed of one TFT 631. Each of the switching elements 63 outputs a high-level voltage H when the high-level voltage H is applied to a selection signal line 62 (VCK) while the high-level voltage H is applied to a scanning connection line 61 (VG). The switching element 63 outputs a low-level voltage L when the high-level voltage H is applied to the selection signal line 62 (VCK) while the low-level voltage L is applied to the scanning connection line 61 (VG). On the other hand, when the low-level voltage L is applied to the selection signal line 62 (VCK), the switching element 63 becomes a high impedance state Z even if the high-level voltage H is applied to the scanning connection line 61 (VG), or even if the low-level voltage L is applied to the scanning connection line 61 (VG).

In an aspect in which the usual scan mode is performed by a set in one side of the sets of the scanning connection lines 61, selection signal lines 62, and selection circuits 6, which are provided on the right and left sides, while the reset mode is performed by the set in the other side, as illustrated in FIG. 9A, the scanning connection line 61 (VG) and a scanning signal line Xn (Vo) are short-circuited to put into a state in which the pulse signal for driving the TFT 51 can pass through in the selection period in which the high-level voltage is applied to the selection signal line 62 (VCK) on the side performing the usual scan mode. In the selection period, on the side performing the reset mode, the switching element 63 becomes the high impedance state Z because the low-level voltage is applied to both the selection signal line 62 (VCK) and the scanning connection line 61 (VG).

In a non-selection period in which the low-level voltage is applied to the selection signal line 62 (VCK) on the side performing the usual scan mode, the switching element 63 becomes the high impedance state Z on the side performing the usual scan mode. Therefore, when the switching element 63 becomes the high impedance state Z on the side performing the reset mode, the scanning signal line Xn becomes a floating state, and a potential at the scanning signal line Xn fluctuates due to the video signal of the video signal line Yn or a noise from the outside, which possibly causes generation of an image defect.

In this example, as illustrated in FIG. 9B, in the non-selection period, the scanning connection line 61 (VG) and the scanning signal line Xn (Vo) are short-circuited by applying the high-level voltage to the selection signal line 62 (VCK) connected to the switching element 63 on the side performing the reset mode, thereby maintaining the scanning signal line Xn (Vo) at the low-level voltage.

Figure 11A:
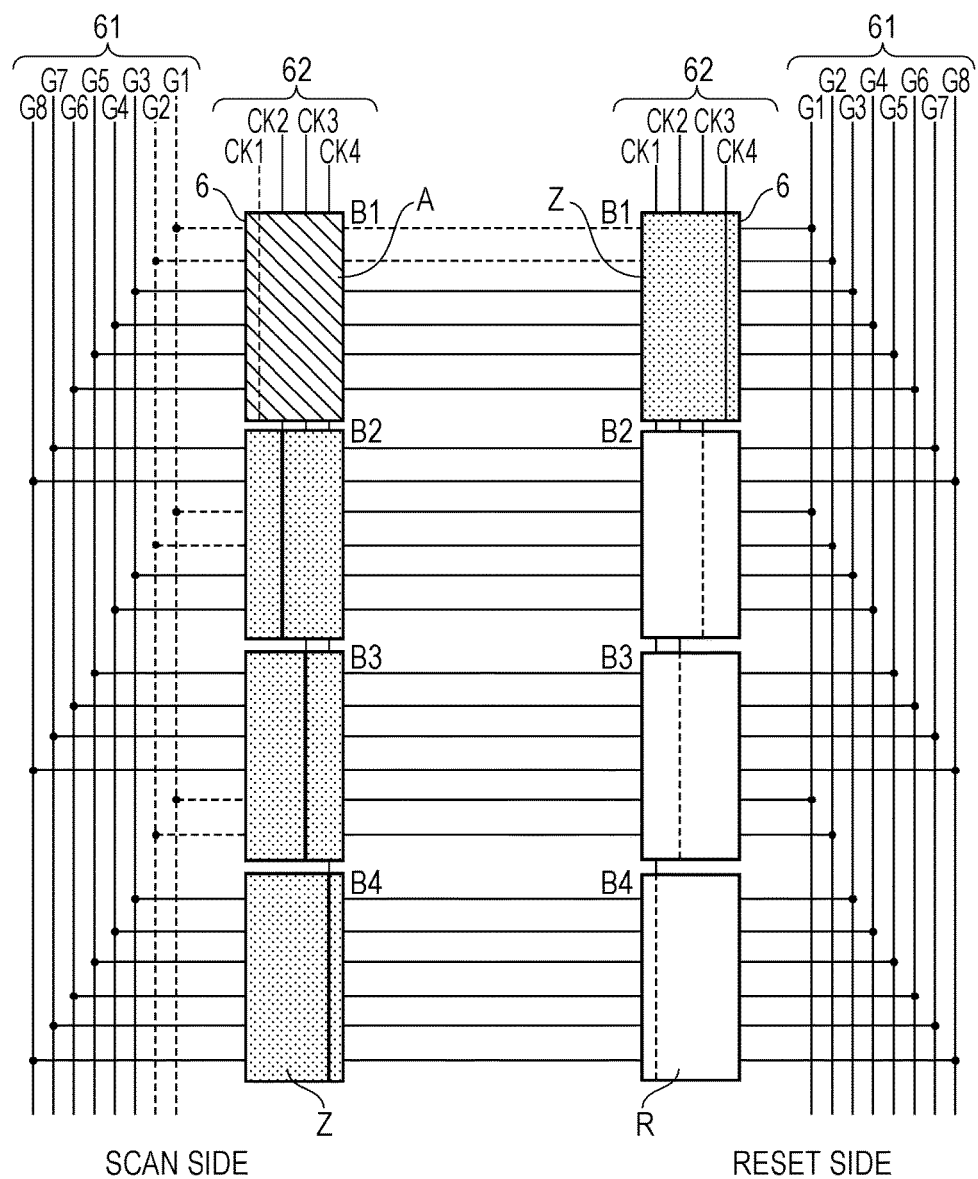
FIGS. 11A and 11B are circuit diagrams illustrating the relationship among scanning connection lines, selection signal lines, and the selection circuits.

Specifically, as illustrated in FIG. 11A, in the first selection period in which the high-level voltage is applied to the left-side selection signal line 62 having the number CK1, the scanning signal drive circuit 211 applies the low-level voltage to the right-side selection signal line 62 having the number CK4 corresponding to the left-side selection signal line 62 having the number CK1 to put the switching elements 63 connected to the right-side selection signal line 62 having the number CK4 into the high impedance state Z. In the first selection period, the scanning signal drive circuit 211 applies the low-level voltage to all the right-side scanning connection lines 61 having the numbers G1 to G8 while applying the high-level voltage to the right-side selection signal lines 62 having the numbers CK1 to CK3 that do not correspond to the left-side selection signal line 62 having the number CK1, thereby outputting the low-level voltage to the switching elements 63 connected to the right-side selection signal lines 62 having the numbers CK1 to CK3. That is, the scanning signal drive circuit 211 puts B1 of the selection circuit 6 on the left side performing the usual scan mode into the active state A to set B2 to B4 of the selection circuits 6 to the high impedance state Z, and puts B1 of the selection circuit 6 on the right side performing the reset mode into the high impedance state Z to set B2 to B4 of the selection circuits 6 to the reset state R in which the low-level voltage is output.

In the second selection period in which the high-level voltage is applied to the left-side selection signal line 62 having the number CK2, the scanning signal drive circuit 211 applies the low-level voltage to the right-side selection signal line 62 having the number CK3 corresponding to the left-side selection signal line 62 having the number CK2 to put the switching elements 63 connected to the right-side selection signal line 62 having the number CK3 into the high impedance state Z. In the second selection period, the scanning signal drive circuit 211 applies the low-level voltage to all the right-side scanning connection lines 61 having the numbers G1 to G8 while applying the high-level voltage to the right-side selection signal lines 62 having the numbers CK1, CK2, and CK4 that do not correspond to the left-side selection signal line 62 having the number CK2, thereby outputting the low-level voltage to the switching elements 63 connected to the right-side selection signal lines 62 having the numbers CK1, CK2, and CK4. That is, the scanning signal drive circuit 211 puts B2 of the selection circuit 6 on the left side performing the usual scan mode into the active state A to set B1, B3, and B4 of the selection circuits 6 to the high impedance state Z, and puts B2 of the selection circuit 6 on the right side performing the reset mode into the high impedance state Z to set B1, B3, and B4 of the selection circuits 6 to the reset state R in which the low-level voltage is output.

In the third selection period in which the high-level voltage is applied to the left-side selection signal line 62 having the number CK3, the scanning signal drive circuit 211 applies the low-level voltage to the right-side selection signal line 62 having the number CK2 corresponding to the left-side selection signal line 62 having the number CK3 to put the switching elements 63 connected to the right-side selection signal line 62 having the number CK2 into the high impedance state Z. In the third selection period, the scanning signal drive circuit 211 applies the low-level voltage to all the right-side scanning connection lines 61 having the numbers G1 to G8 while applying the high-level voltage to the right-side selection signal lines 62 having the numbers CK1, CK3, and CK4 that do not correspond to the left-side selection signal line 62 having the number CK3, thereby outputting the low-level voltage to the switching elements 63 connected to the right-side selection signal lines 62 having the numbers CK1, CK3, and CK4. That is, the scanning signal drive circuit 211 puts B3 of the selection circuit 6 on the left side performing the usual scan mode into the active state A to set B1, B2, and B4 of the selection circuits 6 to the high impedance state Z, and puts B3 of the selection circuit 6 on the right side performing the reset mode into the high impedance state Z to set B1, B2, and B4 of the selection circuits 6 to the reset state R in which the low-level voltage is output.

In the fourth selection period in which the high-level voltage is applied to the left-side selection signal line 62 having the number CK4, the scanning signal drive circuit 211 applies the low-level voltage to the right-side selection signal line 62 having the number CK1 corresponding to the left-side selection signal line 62 having the number CK4 to put the switching elements 63 connected to the right-side selection signal line 62 having the number CK1 into the high impedance state Z. In the fourth selection period, the scanning signal drive circuit 211 applies the low-level voltage to all the right-side scanning connection lines 61 having the numbers G1 to G8 while applying the high-level voltage to the right-side selection signal lines 62 having the numbers CK2 to CK4 that do not correspond to the left-side selection signal line 62 having the number CK4, thereby outputting the low-level voltage to the switching elements 63 connected to the right-side selection signal lines 62 having the numbers CK2 to CK4. That is, the scanning signal drive circuit 211 puts B4 of the selection circuit 6 on the left side performing the usual scan mode into the active state A to set B1 to B3 of the selection circuits 6 to the high impedance state Z, and puts B4 of the selection circuit 6 on the right side performing the reset mode into the high impedance state Z to set B1 to B3 of the selection circuits 6 to the reset state R in which the low-level voltage is output.

Another example in which a counter-stress is applied to the switching element 63 formed of the TFT will be described below.

In the sets of the scanning connection lines 61, selection signal lines 62, and selection circuits 6, which are provided on the right and left sides, the scanning signal drive circuit 211 performs the usual scan mode in the set in one side, performs the reset mode in the set in the other side, switches the usual scan mode and the reset mode in each certain period, and performs the counter-stress mode in which the counter-stress is applied to the selection circuit 6 instead of the reset mode at a certain ratio (for example, about once per 1000 times).

In the counter-stress mode, the low-level voltage is applied to the selection signal line 62 (VCK), and the high-level voltage is applied to the scanning connection line 61 (VG), whereby the switching element 63 becomes the high impedance state Z in the example of FIGS. 8A and 8B. In this case, the scanning signal line Xn becomes the floating state, and the potential at the scanning signal line Xn fluctuates due to the video signal of the video signal line Yn or the noise from the outside, which possibly causes the generation of the image defect.

Figure 10A:
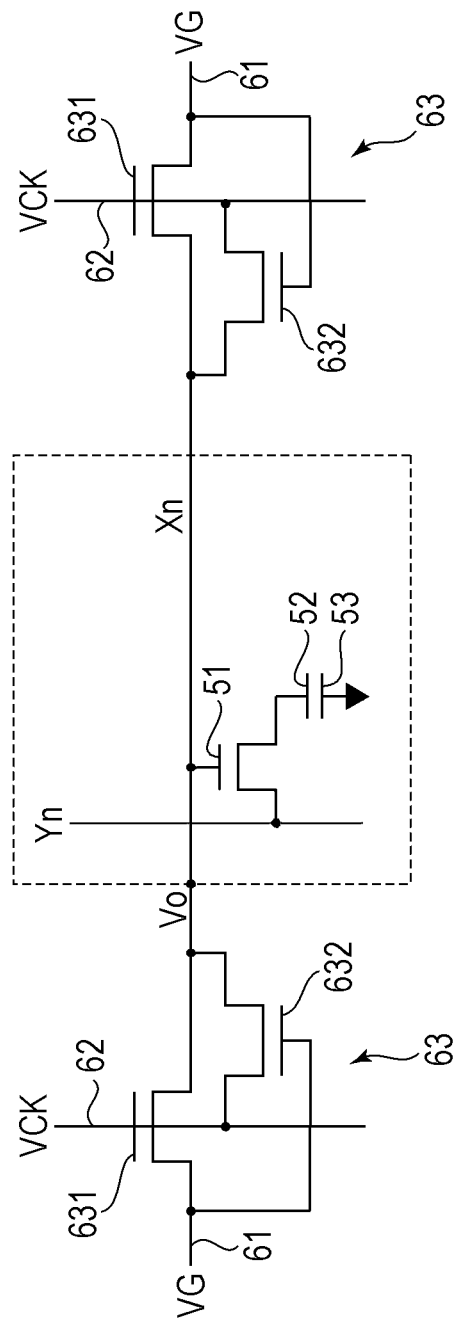
FIG. 10A is a circuit diagram illustrating the relationship among scanning connection lines, selection signal lines, and switching elements.
Figure 10B:
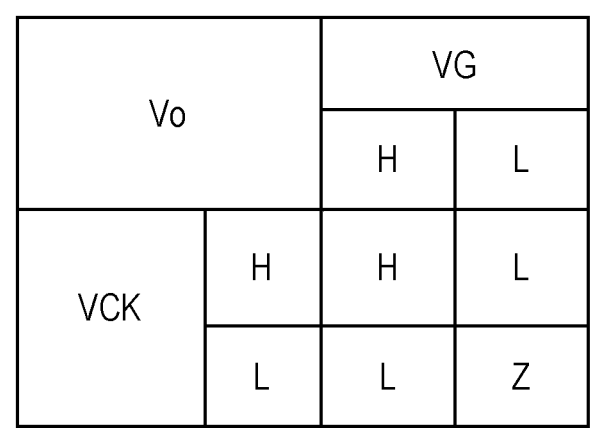

Therefore, in the exemplary embodiment, the switching element 63 is formed of two TFTs 631 and 632 as illustrated in FIGS. 10A and 10B, whereby the scanning signal line Xn (Vo) connected to the switching element 63 to which the counter-stress is applied is maintained at a low-level voltage.

In the TFT 631 of the two TFTs 631 and 632, similarly to the TFT 631 in FIG. 8A, the scanning signal line Xn (Vo) and the scanning connection line 61 (VG) are connected to the source and drain electrodes, and the selection signal line 62 (VCK) is connected to the gate electrode. In the TFT 632, the scanning signal line Xn (Vo) and the selection signal line 62 (VCK) are connected to the source and drain electrodes, and the scanning connection line 61 (VG) is connected to the gate electrode.

In the configuration of FIGS. 10A and 10B, the switching element 63 outputs the low-level voltage L when the low-level voltage L is applied to the selection signal line 62 (VCK) while the high-level voltage H is applied to the scanning connection line 61 (VG). That is, the switching element 63 outputs the low-level voltage L when the counter-stress is applied. Other configurations are similar to those in the example of FIGS. 8A and 8B.

Figure 11B:
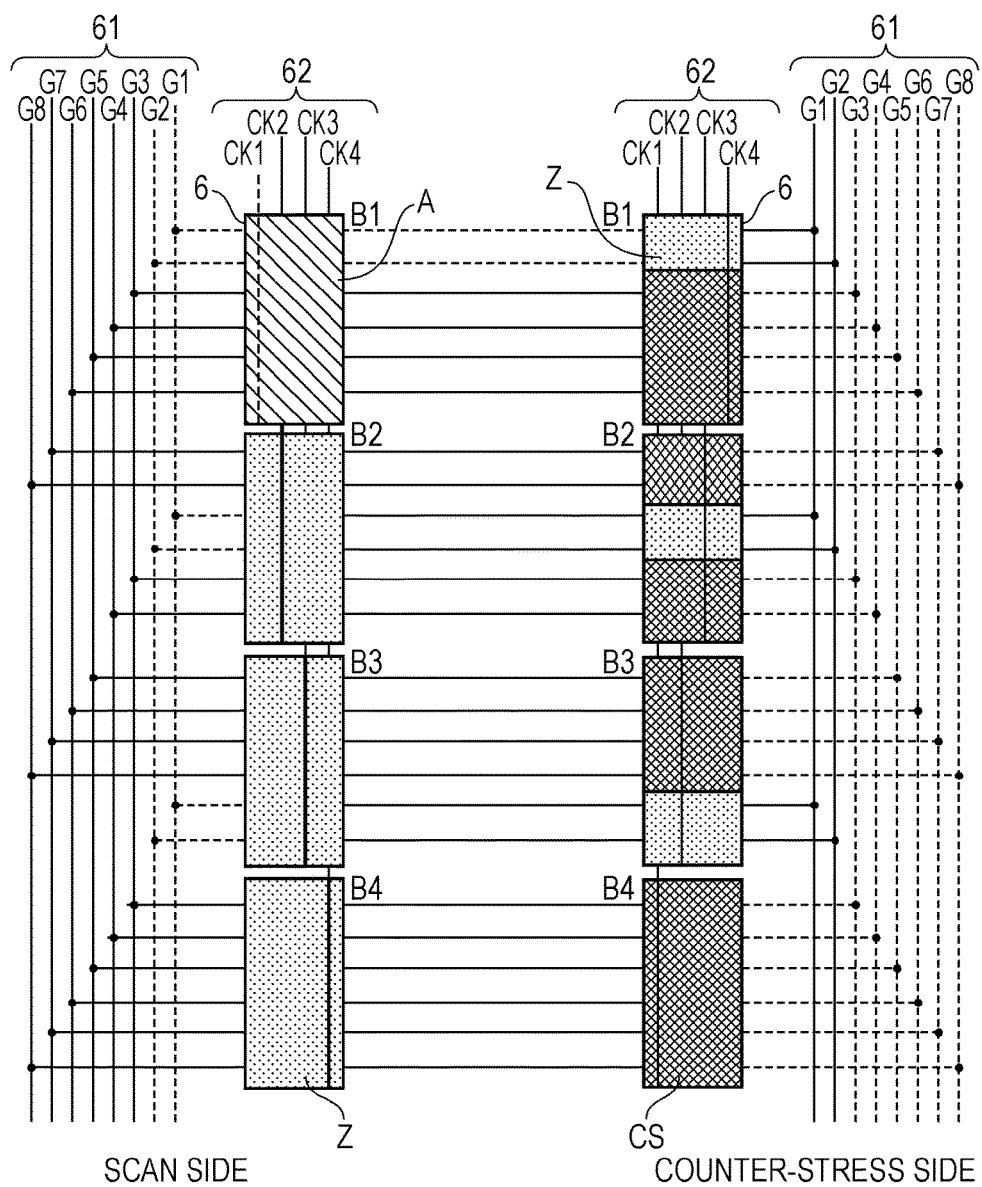

Specifically, as illustrated in FIG. 11B, the scanning signal drive circuit 211 applies the low-level voltage to the selection signal lines 62 having the numbers CK1 to CK4 on the right side performing the counter-stress mode, and applies the high-level voltage to the right-side scanning connection lines 61 having the numbers G1 to G8. Because the pulse signal is sequentially output to the scanning connection lines 61 having the numbers G1 to G8 on the side performing the usual scan mode, the scanning signal drive circuit 211 temporarily switches the high-level voltage applied to the scanning connection lines 61 having the numbers G1 to G8 on the right side performing the counter-stress mode to the low-level voltage in synchronization with the timing to output the pulse signal, and temporarily puts the switching elements 63 into the high impedance state Z. That is, the scanning signal drive circuit 211 applies a reversed-phase signal of the pulse signal output to the scanning connection lines 61 having the numbers G1 to G8 on the left side performing the usual scan mode to the scanning connection lines 61 having the numbers G1 to G8 on the right side performing the counter-stress mode. For example, when the pulse signal is output to the left-side scanning connection line 61 having the number G1, the scanning signal drive circuit 211 applies the low-level voltage to the right-side scanning connection line 61 having the number G1 corresponding to the left-side scanning connection line 61 having the number G1, and applies the high-level voltage to the right-side scanning connection lines 61 having the numbers G2 to G8. FIG. 11B illustrates the state in which the pulse signal is output to the left-side scanning connection lines 61 having the numbers G1 and G2.

The specific configuration of the exemplary embodiment is described above by way of example, but the specific configuration is not limited to the technical scope of the present disclosure. Those skilled in the art can properly modify and optimize contents disclosed in the exemplary embodiment. For example, the layout, number, and shape of the components may arbitrarily be changed on a needed basis.

Figure 12:
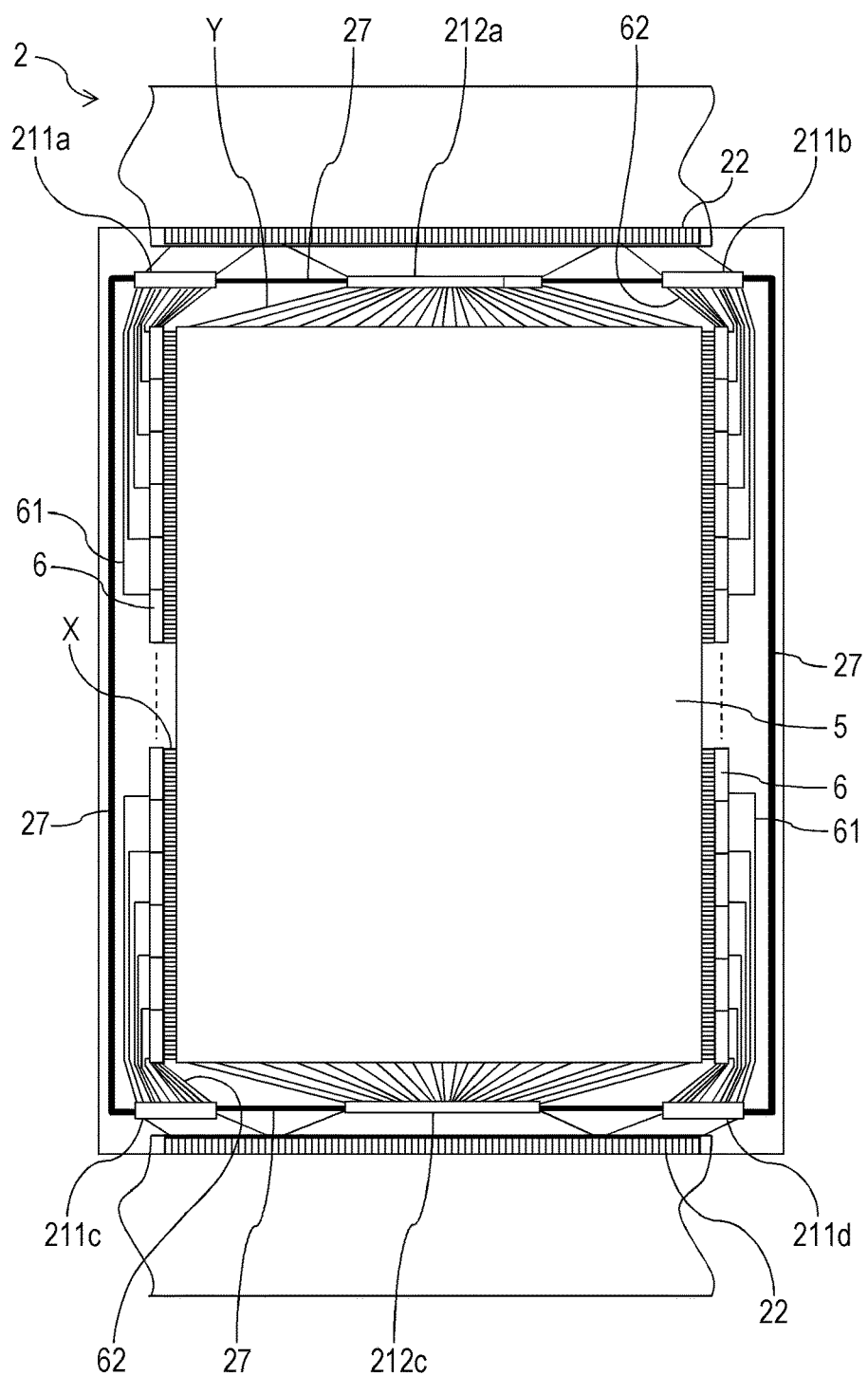
FIG. 12 is a view illustrating a configuration of a circuit formed on an array substrate.

The one driver IC 21 including the scanning signal drive circuit 211 and the video signal drive circuit 212 is provided in the exemplary embodiment. However, the circuit layout is not limited to the exemplary embodiment. For example, as illustrated in FIG. 12, a plurality of drivers IC may be provided along an end edge of the array substrate 2. In the example of FIG. 12, four scanning signal drive circuits 211a to 211d are provided in four corners of the rectangular array substrate 2, respectively.

Specifically, the scanning signal drive circuits 211a and 211b and a video signal drive circuit 212a are provided along an upper edge of the image display area 5. The drive circuits 211a, 211b, and 212a control the display of an upper half of the image display area 5. The scanning signal drive circuits 211a and 211b are separately provided on the right and left sides. The left-side scanning signal drive circuit 211a controls the upper halves of the scanning connection lines 61, selection signal lines 62, and selection circuits 6, which are provided on the left side, and the right-side scanning signal drive circuit 211b controls the upper halves of the scanning connection lines 61, selection signal lines 62, and selection circuits 6, which are provided on the right side.

Similarly, the scanning signal drive circuits 211c and 211d and a video signal drive circuit 212c are provided along a lower edge of the image display area 5. The drive circuits 211c, 211d, and 212c control the display of a lower half of the image display area 5. The scanning signal drive circuits 211c and 211d are separately provided on the right and left sides. The left-side scanning signal drive circuit 211c controls the lower halves of the scanning connection lines 61, selection signal lines 62, and selection circuits 6, which are provided on the left side, and the right-side scanning signal drive circuit 211d controls the lower halves of the scanning connection lines 61, selection signal lines 62, and selection circuits 6, which are provided on the right side.

A communication signal line 27 is provided in a frame-shaped area between the end edges of the array substrate 2 and image display area 5 so as to surround the image display area 5, and the scanning signal drive circuits 211a to 211d and the video signal drive circuits 212a and 212c are connected to each other by the communication signal line 27. The communication signal line 27 is used to control the timing to operate the scanning signal drive circuits 211a to 211d and the video signal drive circuits 212a and 212c.

Figure 13:
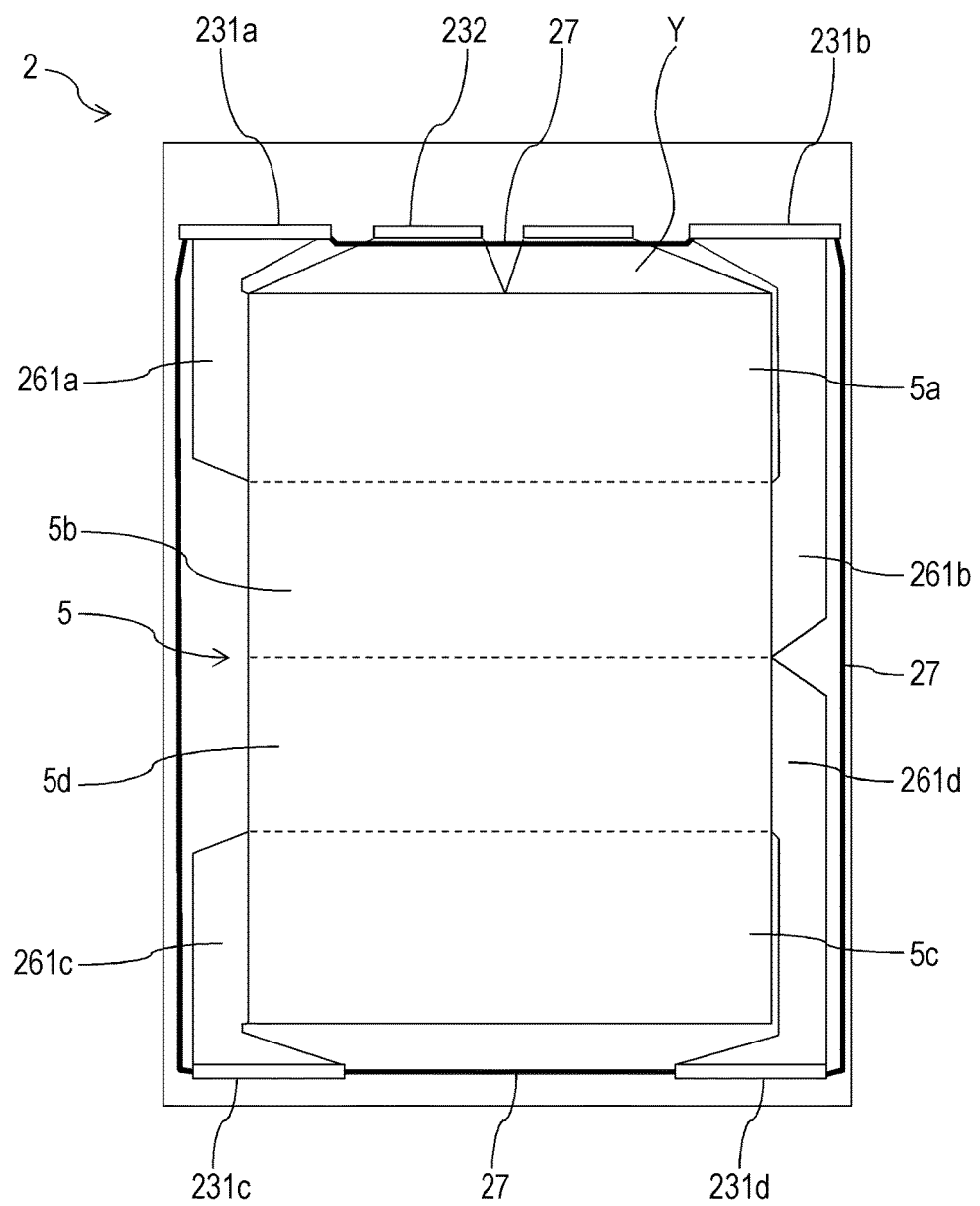
FIG. 13 is a view illustrating a configuration of a circuit formed on an array substrate.

The layout of the plurality of drivers IC is effective in making the liquid crystal display device that does not include the selection circuit 6. For example, in the example of FIG. 13, four scanning signal drive circuits 231a to 231d are provided in four corners of the rectangular array substrate 2, respectively.

Specifically, the scanning signal drive circuits 231a and 231b and video signal drive circuits 232 are provided along the upper edge of the image display area 5, and the scanning signal drive circuits 231a and 231b are separately provided on the right and left sides. The left-side scanning signal drive circuit 231a is connected to a scanning connection line 261a provided on the left side, and the scanning signal drive circuit 231a controls the display of a top area 5a when the image display area 5 is vertically and horizontally divided into four. The right-side scanning signal drive circuit 231b is connected to a scanning connection line 261b provided on the right side, and the scanning signal drive circuit 231b controls the display of an area 5b located at the second highest position when the image display area 5 is vertically and horizontally divided into four.

Similarly, the scanning signal drive circuits 231c and 231d are provided along the lower edge of the image display area 5, and separately provided on the right and left sides. The left-side scanning signal drive circuit 231c is connected to a scanning connection line 261c provided on the left side, and the scanning signal drive circuit 231c controls the display of a bottom area 5c when the image display area 5 is vertically and horizontally divided into four. The right-side scanning signal drive circuit 231d is connected to a scanning connection line 261d provided on the right side, and the scanning signal drive circuit 231d controls the display of an area 5d located at the third highest position when the image display area 5 is vertically and horizontally divided into four.

The communication signal lines 27 are provided in the frame-shaped area between the end edges of the array substrate 2 and image display area 5 so as to surround the image display area 5, and the scanning signal drive circuits 231a to 231d and the video signal drive circuit 232 are connected to each other by the communication signal lines 27. The communication signal lines 27 are used to control the timing to operate the scanning signal drive circuits 231a to 231d and the video signal drive circuits 232.

Modifications of the circuit configuration will be described below.

[First Modification]

Figure 14:
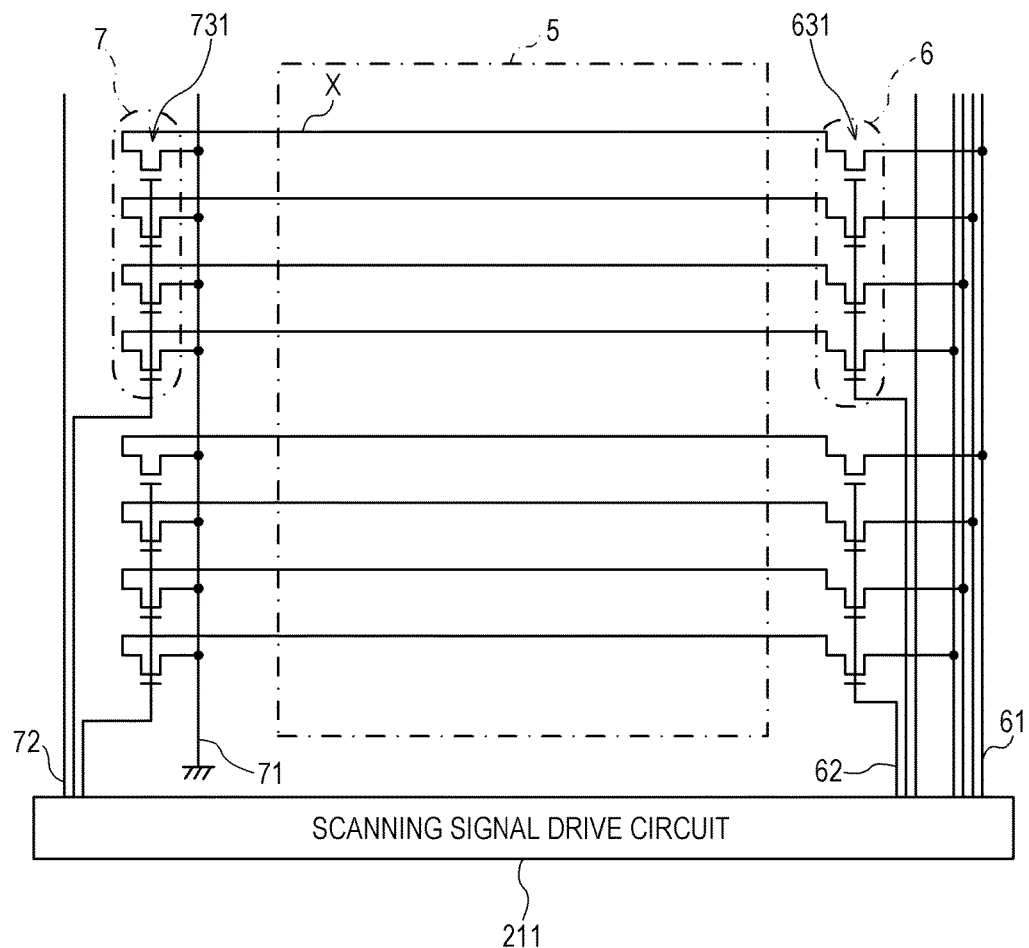
FIG. 14 is a circuit chart illustrating signals applied to scanning connection lines and selection signal lines.
Figure 15:
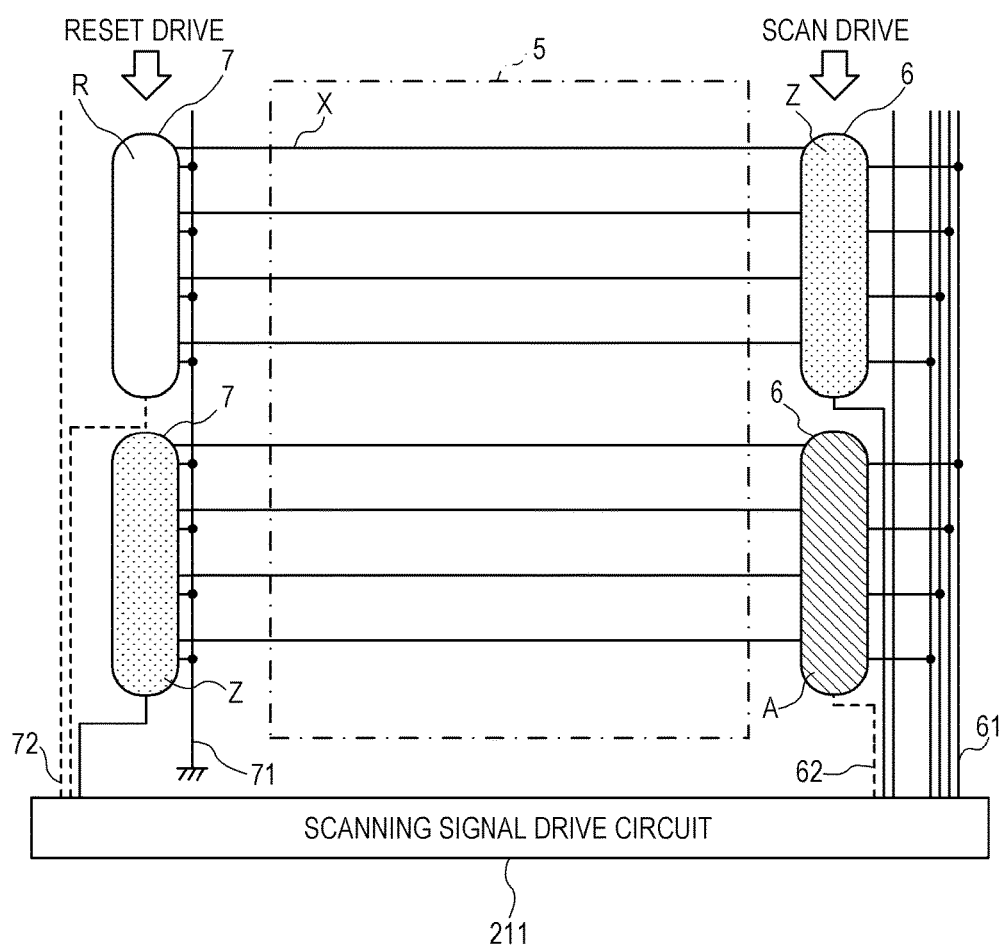
FIG. 15 is a view illustrating a drive example of a circuit in FIG. 14.

FIGS. 14 and 15 illustrate a first modification of the circuit configuration. The configuration already described above is designated by the same reference marks, and the detailed description is omitted. The numbers of scanning signal lines X, scanning connection lines 61, selection signal lines 62, TFTs 631, scanning connection lines 71, selection signal lines 72, and TFTs 731 are not limited to those in the first modification in FIGS. 14 and 15.

As illustrated in FIG. 14, similarly to the exemplary embodiment, the scanning connection lines 61, the selection signal lines 62, and the TFTs 631 are provided on the right side (the right side for an observer who observes the drawing) of the image display area 5. The plurality of TFTs 631, which are commonly connected to the one selection signal line 62 and connected to the scanning connection lines 61 different from one another, constitute the one selection circuit 6. At this point, the scanning connection line 61, the selection signal line 62, and the TFT 631 are examples of first scanning connection line, first selection signal line, and first thin film transistor.

On the other hand, a scanning connection line 71, selection signal lines 72, and TFTs 731 are provided on the left side (the left side for the observer who observes the drawing) of the image display area 5. The plurality of TFTs 731 commonly connected to the one selection signal line 72 constitute one reset circuit 7. At this point, the scanning connection line 71, the selection signal line 72, and the TFT 731 are examples of second scanning connection line, second selection signal line, and second thin film transistor.

The scanning connection line 71 is used to supply the low-level voltage L to the scanning signal line X through the TFT 731. Only one scanning connection line 71 is provided in the first modification, and all the TFTs 731 are commonly connected to the one scanning connection line 71.

In the first modification, the low-level voltage L is applied to the scanning connection line 71 by grounding the scanning connection line 71. Alternatively, the scanning connection line 71 may be connected to a power supply supplying the low-level voltage L, or the scanning connection line 71 may be connected to the scanning signal drive circuit 211 to apply the low-level voltage L to the scanning connection line 71 from the scanning signal drive circuit 211.

Note that, the number of scanning connection lines 71 is not limited to one, but at least two scanning connection lines 71 may be provided. For example, when the adjacent TFTs 731 are connected to the scanning connection lines 71 different from each other, facilitation of wiring inspection can be made.

The selection signal line 72 and the TFTs 731 are provided similarly to the selection signal line 62 and the TFTs 631. That is, the scanning signal line X and the scanning connection line 71 are connected to the source and drain electrodes of the TFT 731, and the selection signal line 72 is connected to the gate electrode of the TFT 731.

The plurality of TFTs 731 commonly connected to the one selection signal line 72 correspond to the plurality of TFTs 631 commonly connected to the selection signal line 62. That is, the plurality of TFTs 731 included in the one reset circuit 7 are individually connected to the plurality of scanning signal lines X individually connected to the plurality of TFTs 631 included in the one selection circuit 6.

FIG. 15 is a view illustrating a drive example of the circuit in FIG. 14. In FIG. 15, in the selection signal lines 62 and the selection signal lines 72, the line to which the high-level voltage H is applied is indicated by a broken line.

The selection circuit 6 in which the high-level voltage H is applied to the selection signal line 62 is hatched, and the letter "A" indicating the active state is added to the hatched selection circuit 6. The selection circuit 6 in which the low-level voltage L is applied to the selection signal line 62 is dotted, and the letter "Z" indicating the high impedance state is added to the dotted selection circuit 6.

The reset circuit 7 in which the low-level voltage L is applied to the selection signal line 72 is dotted, and the letter "Z" indicating the high impedance state is added to the dotted reset circuit 7. The reset circuit 7 in which the high-level voltage H is applied to the selection signal line 72 is indicated by the white blank portion, and the letter "R" indicating the reset state is added to the reset circuit 7 indicated by the white blank portion.

Similarly to the exemplary embodiment, the scanning signal drive circuit 211 performs the usual scan mode (scan drive) using the scanning connection lines 61, selection signal lines 62, selection circuits 6, which are provided on the right side of the image display area 5, and performs the reset mode (reset drive) using the scanning connection line 71, selection signal lines 72, and reset circuits 7, which are provided on the left side of the image display area 5.

That is, in the usual scan mode, the scanning signal drive circuit 211 sequentially applies a gate-on voltage to the plurality of selection signal lines 62, and sequentially supplies the pulse signal to the plurality of scanning connection lines 61 in the selection period in which the gate-on voltage is applied to each of the selection signal lines 62.

In the reset mode, the scanning signal drive circuit 211 applies a gate-off voltage to the selection signal line 72 corresponding to the selection signal line 62 to which the gate-on voltage is applied, and the scanning signal drive circuit 211 applies the gate-on voltage to other selection signal lines 72.

Therefore, in the plurality of selection circuits 6, the selection circuit 6 in which the gate-on voltage is applied to the selection signal line 62 becomes the active state A, and other selection circuits 6 become the high impedance state Z.

In the plurality of reset circuits 7, the reset circuit 7 corresponding to the selection circuit 6 in the active state A becomes the high impedance state Z, and other reset circuits 7 become the reset state R in which the low-level voltage L is output.

Thus, the scanning signal line X is maintained at the low-level voltage L by putting the reset circuit 7 corresponding to the selection circuit 6 put into the high impedance state Z to the reset state R, which prevents the scanning signal line X from becoming floating state.

[Second Modification]

FIGS. 16 to 20 illustrate a second modification of the circuit configuration. The configuration already described above is designated by the same reference marks, and the detailed description is omitted. The numbers of scanning signal lines X, scanning connection lines 61, selection signal lines 62, TFTs 631, scanning connection lines 71, selection signal lines 72, and TFTs 731 are not limited to those in the second modification in FIGS. 16 to 20.

Figure 16:
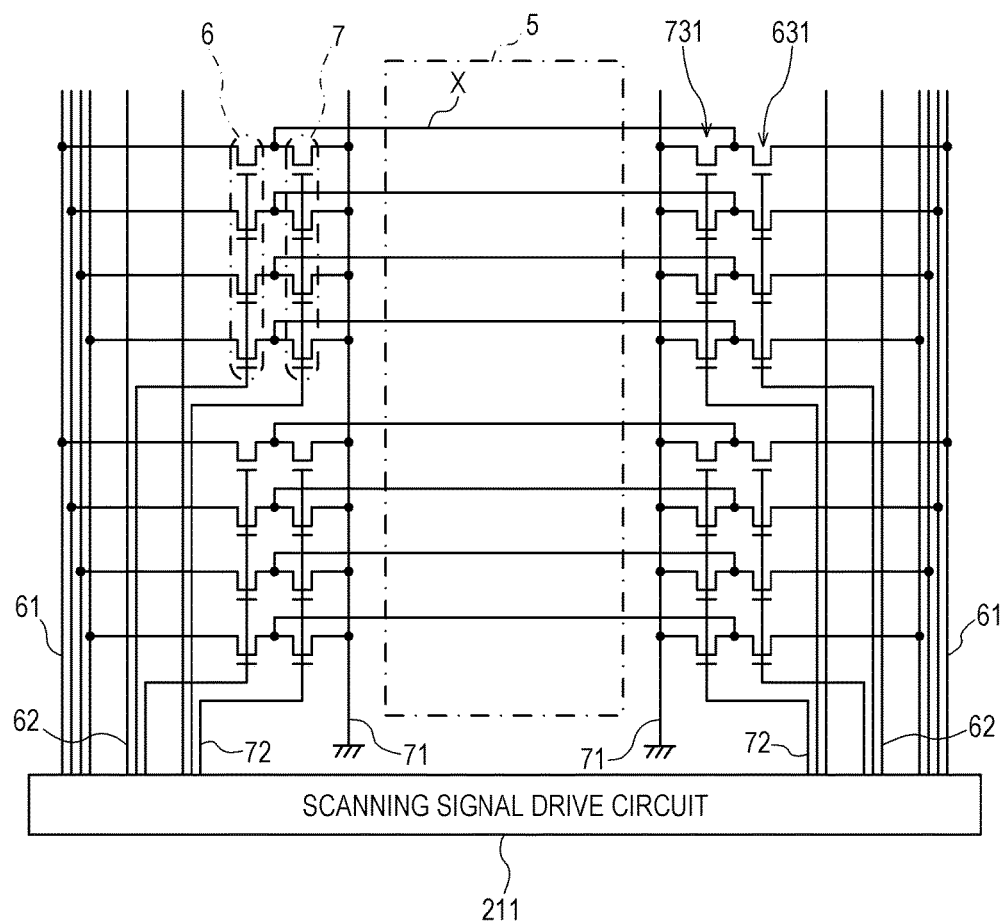
FIG. 16 is a circuit chart illustrating signals applied to scanning connection lines and selection signal lines.

As illustrated in FIG. 16, the scanning connection lines 61, the selection signal lines 62, the TFTs 631, the scanning connection line 71, the selection signal lines 72, and the TFTs 731 are provided on each of the right and left sides of the image display area 5. Each of right and left ends of the scanning signal line X is connected to the scanning connection line 61 through the TFT 631, and connected to the scanning connection line 71 through the TFT 731. Specifically, the scanning signal line X is connected between the TFTs 631 and 731 connected in series to each other.

FIGS. 17 to 20 are views illustrating a drive example of the circuit in FIG. 16. In FIGS. 17 to 20, the states of the selection circuit 6 and reset circuit 7 are illustrated similarly to the state in FIG. 15. The selection circuit 6 and reset circuit 7 in a pause state are illustrated with no frame and no pattern.

The pause state means a state in which the low-level voltage L is applied to all the selection signal lines 62 or selection signal lines 72 on one side of the right and left sides of the image display area 5. At this point, all the TFTs 631 or TFTs 731 connected to the selection signal lines 62 or selection signal lines 72 become the high impedance state Z.

Figure 17:
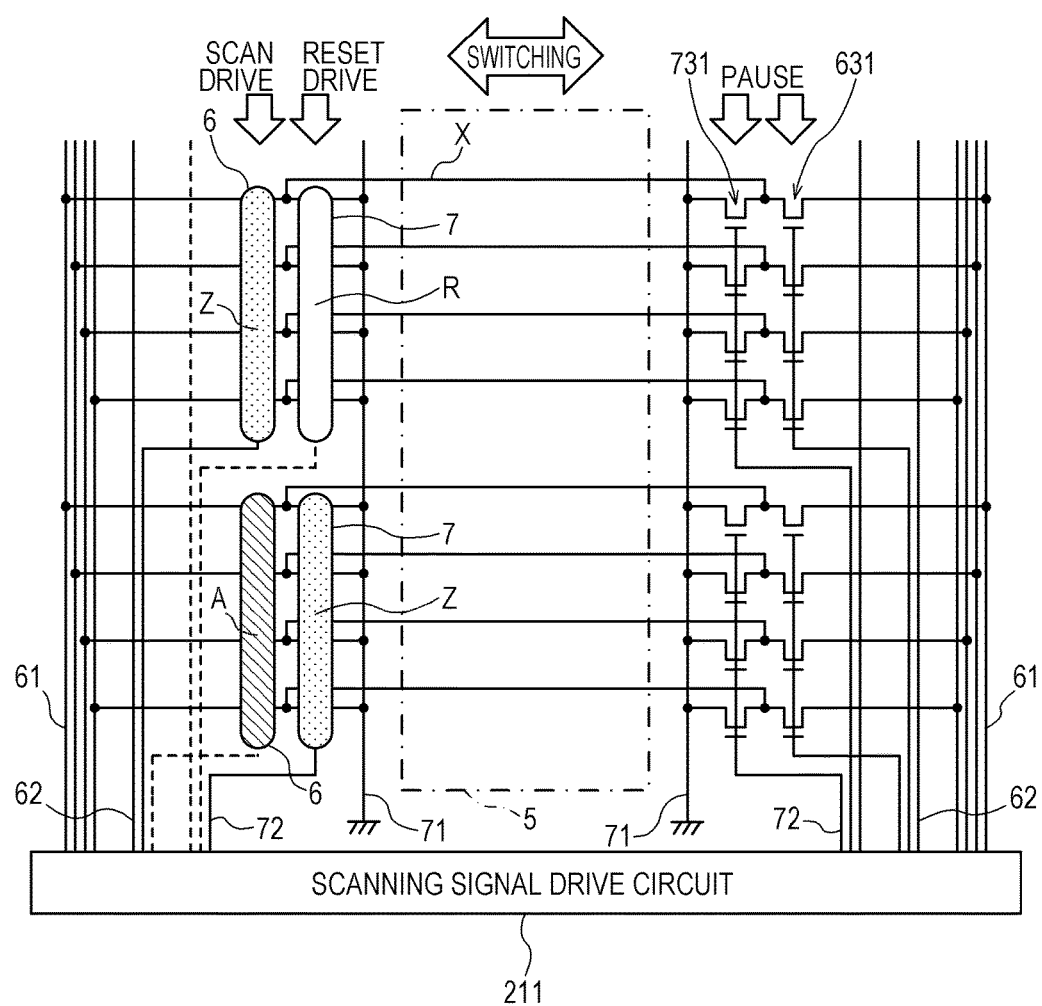
FIG. 17 is a view illustrating a drive example of a circuit in FIG. 16.

In a first drive example of FIG. 17, the scanning signal drive circuit 211 switches, to the left side or the right side, the operation to perform the usual scan mode and the reset mode using the selection circuit 6 and reset circuit 7 on one side of the right and left sides at constant intervals of the period. The selection circuit 6 that does not perform the usual scan mode and the reset circuit 7 that does not perform the reset mode are put into the pause state.

Figure 18:
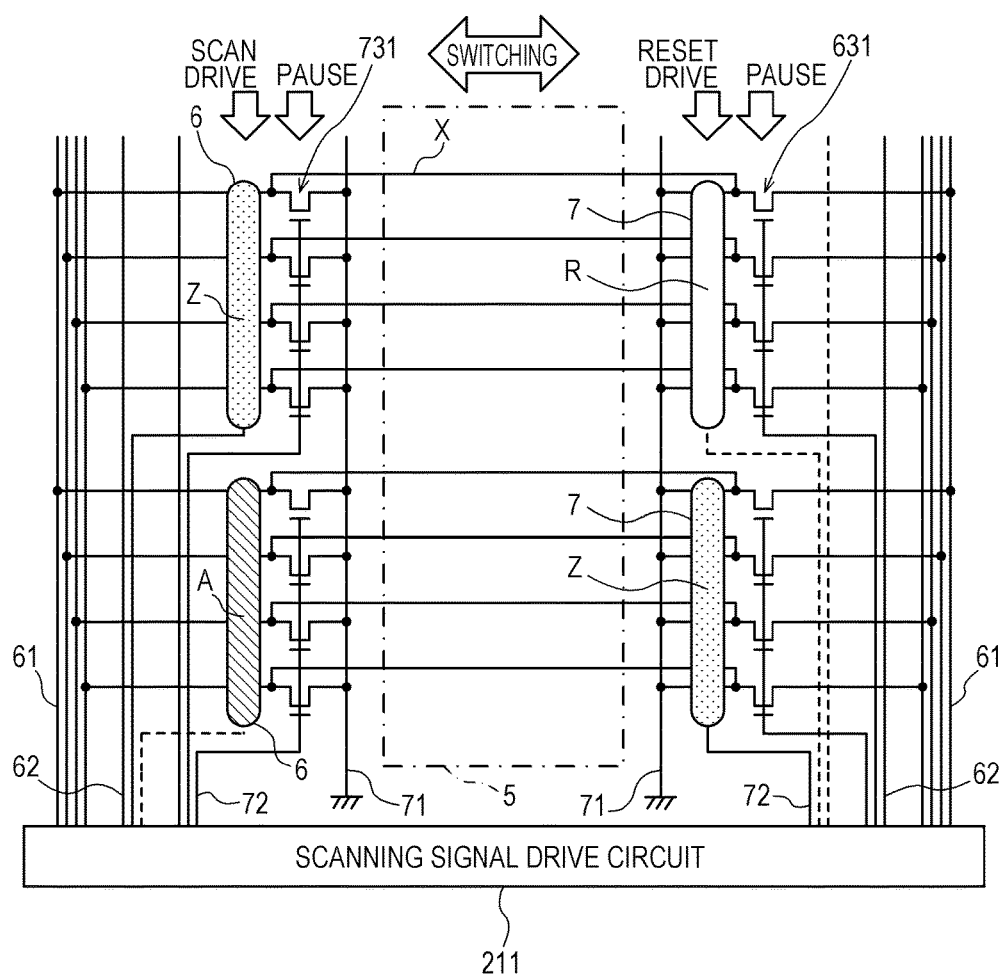
FIG. 18 is a view illustrating a drive example of a circuit in FIG. 16.

In a second drive example of FIG. 18, the scanning signal drive circuit 211 switches, to the left side or the right side, the operation in which the usual scan mode is performed by the selection circuit 6 on one side of the right and left sides while the reset mode is performed by the reset circuit 7 on the other side of the right and left sides at constant intervals of the period. The selection circuit 6 that does not perform the usual scan mode and the reset circuit 7 that does not perform the reset mode are put into the pause state.

In the first and second drive examples, the degradation of the amorphous silicon included in the TFTs 631 and 731 can be delayed by alternately using the selection circuits 6 and reset circuits 7 on the right and left sides. As a result, the lifetime of the liquid crystal display device can be lengthened.

The period in which the usual scan mode of the selection circuit 6 is switched on the right and left sides is not necessarily equal to the period in which the reset mode of the reset circuit 7 is switched on the right and left sides, but the periods may be different from each other. That is, the switching may be performed such that the first drive example and the second drive example are mixed.

Figure 19:
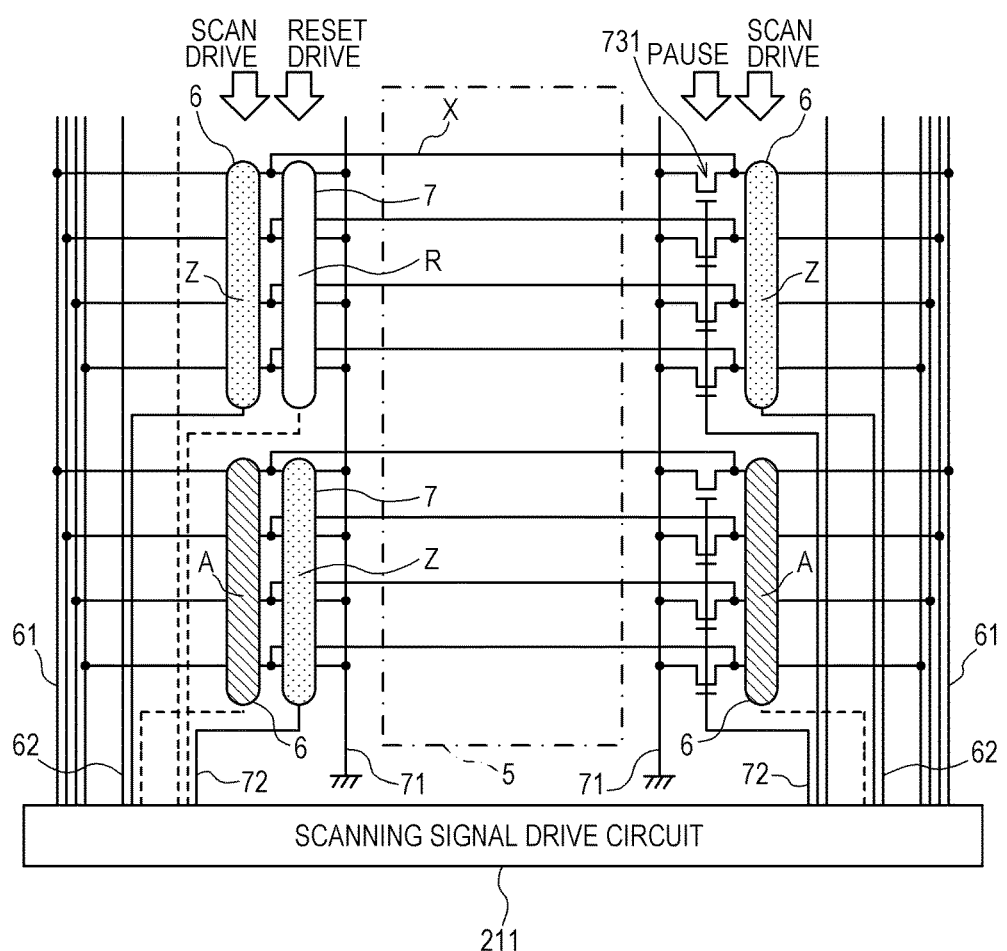
FIG. 19 is a view illustrating a drive example of a circuit in FIG. 16.

In a third drive example of FIG. 19, the scanning signal drive circuit 211 performs the usual scan mode using the selection circuits 6 on both the right and left sides. At this point, the scanning signal drive circuit 211 may switch the operation in which the reset mode is performed by the reset circuit 7 on one side of the right and left sides at constant intervals of the period, or perform the reset mode using the reset circuits 7 on both the right and left sides.

In the third drive example, the scanning signal is input to the scanning signal line X from the selection circuits 6 on both the right and left sides, so that the waveform of the scanning signal can be prevented from becoming dull. Particularly the third drive example is suitable for a large-screen liquid crystal display device.

Figure 20:
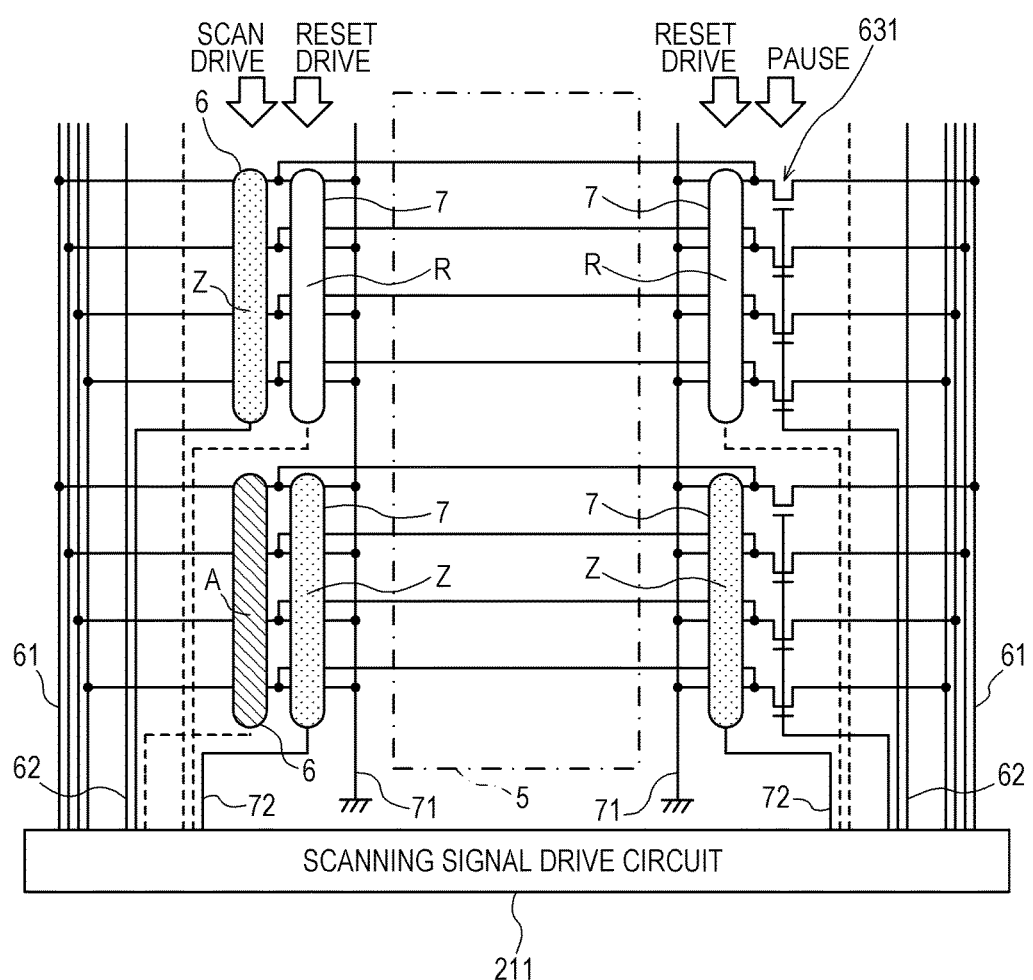
FIG. 20 is a view illustrating a drive example of a circuit in FIG. 16.

In a fourth drive example of FIG. 20, the scanning signal drive circuit 211 performs the reset mode using the reset circuits 7 on the right and left sides. At this point, the scanning signal drive circuit 211 may switch the operation in which the usual scan mode is performed by the selection circuit 6 on one side of the right and left sides at constant intervals of the period, or perform the usual scan mode using the selection circuits 6 on the right and left sides.

Because the degradation of the amorphous silicon included in the TFT 731 of the reset circuit 7 is slower than the degradation of the amorphous silicon included in the TFT 631 of the selection circuit 6, the lifetime of the liquid crystal display device is slightly influenced even if the reset mode may be performed by the reset circuits 7 on the right and left sides.

The first to fourth drive examples are described above. Alternatively, the period in which the performance and pause of the usual scan mode with selection circuit 6 on one side of the right and left sides are switched, the period in which the performance and pause of the usual scan mode with selection circuit 6 on the other side of the right and left sides are switched, the period in which the performance and pause of the reset mode with reset circuit 7 on one side of the right and left sides are switched, and the period in which the performance and pause of the reset mode with reset circuit 7 on the other side of the right and left sides are switched may separately be set as long as the selection circuits 6 on the right and left sides do not become simultaneously the pause state, or as long as the reset circuits 7 on the right and left sides do not become simultaneously the pause state.

Note that, the first and second modifications described above can properly be combined with various features of the exemplary embodiment. For example, in the first and second modifications, as described above with reference to FIGS. 4 and 5, the number of scanning connection lines 61 may be increased by at least one as compared to the number of TFTs 631 connected to the one selection signal line 62. Additionally, the time width of the pulse signal sequentially output to the scanning connection lines 61 is longer than one horizontal scanning period (1H), and the next pulse signal and the preceding pulse signal may temporally be overlapped with each other such that the next pulse signal rises before the preceding pulse signal falls.

The aforementioned embodiments mainly include the display devices having the following features.

In one general aspect, the instant application describes a display device which includes an image display area that includes a plurality of pixels sectioned by a plurality of scanning signal lines and a plurality of video signal lines, a plurality of first scanning connection lines connected to the plurality of scanning signal lines, a plurality of first thin film transistors that are interposed between the scanning signal lines and the first scanning connection lines, each of the scanning signal lines and each of the first scanning connection lines being connected to a source electrode and a drain electrode of a corresponding one of the first thin film transistors, the plurality of first thin film transistors including a first group of first thin film transistors and a second group of first thin film transistors, a plurality of first selection signal lines. One of the plurality of first selection signal lines is connected to a gate electrode of each of the first thin film transistors of the first group of first thin film transistors, each of the first thin film transistors of the first group of the first thin film transistors being connected to a different one of the first scanning connection lines, a plurality of second scanning connection lines connected to the plurality of scanning signal lines, a plurality of second thin film transistors that are interposed between the scanning signal lines and the second scanning connection lines, each of the scanning signal lines and each of the second scanning connection lines being connected to a source electrode and a drain electrode of a corresponding one of the second thin film transistors, the plurality of second thin film transistors including a third group of second thin film transistors and a fourth group of second thin film transistors, a plurality of second selection signal lines. One of the plurality of second selection signal lines is connected to a gate electrode of each of the second thin film transistors of the third group of second thin film transistors, the third group of second thin film transistors, which correspond to the first group of first thin film transistors that are connected to the one of the plurality of first selection signal lines, being connected to the one of the plurality of second selection signal lines and a scanning signal drive circuit connected to the first scanning connection lines, the first selection signal lines, and the second selection signal lines. The scanning signal drive circuit sequentially supplies a pulse signal to the first scanning connection lines in a selection period in which a gate-on voltage is applied to the one of the plurality of first selection signal lines. The scanning signal drive circuit applies a gate-off voltage to the one of the plurality of second selection signal lines corresponding to the one of the plurality of first selection signal lines to which the gate-on voltage is applied.

The above general aspect may include one or more of the following features.

A low-level voltage may be applied to the second scanning connection lines, and the scanning signal drive circuit may apply a gate-on voltage to the second selection signal lines except for the one of the plurality of second selection signal lines corresponding to the one of the plurality of first selection signal lines to which the gate-on voltage is applied.

The first scanning connection lines, the first thin film transistors, and the first selection signal lines may be provided on one side of the scanning signal lines, and the second scanning connection lines, the second thin film transistors, and the second selection signal lines are provided on the other side of the scanning signal lines.

In another general aspect, the display device of the instant application includes an image display area that includes a plurality of pixels sectioned by a plurality of scanning signal lines and a plurality of video signal lines, a plurality of first scanning connection lines connected to the plurality of scanning signal lines, a plurality of first thin film transistors that are interposed between the scanning signal lines and the first scanning connection lines, each of the scanning signal lines and each of the first scanning connection lines being connected to a source electrode and a drain electrode of a corresponding one of the first thin film transistors, the plurality of first thin film transistors including a first group of first thin film transistors and a second group of first thin film transistors, a plurality of first selection signal lines. One of the plurality of first selection signal lines is connected to a gate electrode of each of the first thin film transistors of the first group of first thin film transistors, each of the first thin film transistors of the first group of the first thin film transistors being connected to a different one of the first scanning connection lines, at least one second scanning connection line connected to each of the plurality of scanning signal lines, a plurality of second thin film transistors that are interposed between the scanning signal lines and the second scanning connection line, each of the scanning signal lines and the second scanning connection line being connected to a source electrode and a drain electrode of a corresponding one of the second thin film transistors, the plurality of second thin film transistors including a third group of second thin film transistors and a fourth group of second thin film transistors, a plurality of second selection signal lines, wherein one of the plurality of second selection signal lines is connected to a gate electrode of each of the second thin film transistors of the third group of second thin film transistors, the third group of second thin film transistors, which correspond to the first group of first thin film transistors that are connected to the one of the plurality of first selection signal lines, being connected to the one of the plurality of second selection signal lines, and a scanning signal drive circuit connected to the first scanning connection lines, the first selection signal lines, and the second selection signal lines. The scanning signal drive circuit sequentially supplies a pulse signal to the first scanning connection lines in a selection period in which a gate-on voltage is applied to the one of the plurality of first selection signal lines, and the scanning signal drive circuit applies a gate-off voltage to the one of the plurality of second selection signal lines corresponding to the one of the plurality of first selection signal lines to which the gate-on voltage is applied.

The above general aspect may include one or more of the following features.

The second scanning connection line may be not connected to the scanning signal drive circuit.

The first scanning connection lines, the first thin film transistors, the first selection signal lines, the second scanning connection line, the second thin film transistors, and the second selection signal lines may be provided on one side of the scanning signal lines.

The first scanning connection lines, the first thin film transistors, the first selection signal lines, the second scanning connection line, the second thin film transistors, and the second selection signal lines may be provided on each side of the scanning signal lines.

The scanning signal drive circuit may alternately perform a first mode in which the pulse signal is sequentially supplied to the first scanning connection lines in the selection period in which the gate-on voltage is applied to one of the first selection signal lines on one side of the scanning signal lines and a second mode in which the pulse signal is sequentially supplied to the first scanning connection lines in the selection period in which the gate-on voltage is applied to one of the first selection signal lines on the other side of the scanning signal lines.

The scanning signal drive circuit may alternately perform a first mode in which the gate-off voltage is applied to second selection signal lines, of the second selection signal lines, corresponding to the first selection signal lines to which the gate-on voltage is applied on one side of the scanning signal lines, and a second mode in which the gate-off voltage is applied to the second selection signal lines, of the second selection signal lines, corresponding to the first selection signal lines to which the gate-on voltage is applied on the other side of the scanning signal lines.

The scanning signal drive circuit may sequentially supply the pulse signal to the first scanning connection lines in the selection period in which the gate-on voltage is applied to one of the first selection signal lines on both sides of the scanning signal lines.

The scanning signal drive circuit may apply the gate-off voltage to the second selection signal line, of the second selection signal lines, corresponding to the first selection signal line to which the gate-on voltage is applied on both sides of the scanning signal lines.

The first scanning connection lines, the first thin film transistors, and the first selection signal lines may be provided on one side of the scanning signal lines, and the second scanning connection line, the second thin film transistors, and the second selection signal line may be provided on the other side of the scanning signal lines.

In another general aspect, the display device of the instant application includes an image display area that includes a plurality of pixels sectioned by a plurality of scanning signal lines and a plurality of video signal lines, a plurality of scanning connection lines connected to the plurality of scanning signal lines, a plurality of thin film transistors that are interposed between the scanning signal lines and the scanning connection lines, each of the scanning signal lines and each of the scanning connection lines being connected to a source electrode and a drain electrode of a corresponding one of the thin film transistors, the plurality of thin film transistors including a first group of thin film transistors and a second group of thin film transistors, a plurality of selection signal lines, wherein one of the plurality of selection signal lines is connected to a gate electrode of each of the thin film transistors of the first group of thin film transistors, each of the thin film transistors of the first group of thin film transistors being connected to a different one of the scanning connection lines, and a scanning signal drive circuit connected to the scanning connection lines and the selection signal lines. A number of scanning connection lines is larger than a number of thin film transistors connected to the one of the plurality of selection signal lines.

The above general aspect may include one or more of the following features.

The scanning signal drive circuit may sequentially output a pulse signal to a scanning connection line of the plurality of scanning connection lines connected to a thin film transistor which is connected to the first selection signal line in a first selection period in which a gate-on voltage is applied to the first selection signal line in the selection signal lines, and the scanning signal drive circuit may output the pulse signal to a scanning connection line of the plurality of scanning connection lines not connected to the thin film transistor which is connected to the first selection signal line while starting a second selection period in which the gate-on voltage is applied to a second selection signal line in the selection signal lines before the first selection period is ended.

The scanning signal drive circuit may sequentially output the pulse signal having a time width longer than one horizontal scanning period such that a next pulse signal rises before a preceding pulse signal falls.

Rising timing of the pulse signal output to the scanning connection line may be earlier than a supply start timing at which a video signal voltage corresponding to a pixel value is supplied from each of the video signal lines to the pixel corresponding to the scanning connection line.

The scanning signal drive circuit may supply a high-level voltage to the scanning connection line not connected to the thin film transistor which is connected to the first selection signal line in the first selection period.

The scanning signal drive circuit may start the second selection period after switching a voltage, which is supplied to the scanning connection line not connected to the thin film transistor which is connected to the first selection signal line, from the high-level voltage to a low-level voltage.

The scanning signal drive circuit may switch a voltage, which is supplied to the scanning connection line not connected to the thin film transistor which is connected to the second selection signal line, from a low-level voltage to the high-level voltage after ending the first selection period.

In another general aspect, the display device of the instant application which includes an image display area that includes a plurality of pixels sectioned by a plurality of scanning signal lines and a plurality of video signal lines, a plurality of scanning connection lines connected to the plurality of scanning signal lines, a plurality of thin film transistors that are interposed between the scanning signal lines and the scanning connection lines, each of the scanning signal lines and each of the scanning connection lines being connected to a source electrode and a drain electrode of a corresponding one of the thin film transistors, the plurality of thin film transistors including a first group of thin film transistors and a second group of thin film transistors, a plurality of selection signal lines, wherein one of the plurality of selection signal lines is connected to a gate electrode of each of the thin film transistors of the first group of thin film transistors, each of the thin film transistors of the first group of thin film transistors being connected to a different one of the scanning connection lines, and a scanning signal drive circuit that is connected to the scanning connection lines and the selection signal lines. The scanning connection lines, the thin film transistors, and the selection signal lines are provided on each side of the scanning signal lines.

The scanning signal drive circuit may perform a usual scan mode in which a pulse signal is sequentially supplied to the scanning connection lines in a selection period in which a gate-on voltage is applied to one of the selection signal lines on one of the sides, and the scanning signal drive circuit may perform a reset mode in which the gate-on voltage is applied to other selection signal lines except for the selection signal line corresponding to the selection signal line on one side to which the gate-on voltage is applied while a low-level voltage is applied to the scanning connection line on the other side.

The scanning signal drive circuit may apply a gate-off voltage to the second selection signal line corresponding to the selection signal line on one side to which the gate-on voltage is applied on the other side performing the reset mode.

The display device may further include a plurality of thin film transistors in each of which a source electrode and a drain electrode are connected to the scanning signal lines and the selection signal lines while a gate electrode is connected to the scanning connection lines.

The scanning signal drive circuit may perform a counter-stress mode in which the gate-off voltage is applied to the selection signal line while the high-level voltage is applied to the scanning connection line on the other side instead of the reset mode, the low-level voltage being applied to the scanning connection line on one side to which the pulse signal is supplied in synchronization with timing to supply the pulse signal in the counter-stress mode.

In another general aspect, the display device of the instant application includes an image display area that includes a plurality of pixels sectioned by a plurality of scanning signal lines and a plurality of video signal lines, a plurality of scanning connection lines connected to the plurality of scanning signal lines, a plurality of switching elements that are interposed between the scanning signal lines and the scanning connection lines, each of the switching elements short-circuiting each of the scanning signal lines and each of the scanning connection lines in response to a selection signal, the plurality of switching elements including a first group of switching elements and a second group of switching elements, a plurality of selection signal lines that transmit the selection signal to the switching elements, each of the plurality of switching elements of the first group of switching elements being connected to a different one of the scanning connection lines, and a scanning signal drive circuit that is connected to the scanning connection lines and the selection signal lines. The scanning connection lines, the switching elements, and the selection signal lines are provided on each side of the scanning signal lines. The switching elements include a plurality of first thin film transistors in each of which a source electrode and a drain electrode are connected to a corresponding one of the scanning signal lines and a corresponding one of the scanning connection lines while a gate electrode is connected to a corresponding one of the selection signal lines, and a plurality of second thin film transistors in each of which a source electrode and a drain electrode are connected to a corresponding one of the scanning signal lines and a corresponding one of the selection signal lines while a gate electrode is connected to a corresponding one of the scanning connection lines.

The above general aspect may include one or more of the following features.

The scanning signal drive circuit may perform a usual scan mode in which a pulse signal is sequentially supplied to the scanning connection lines in a selection period in which a gate-on voltage is applied to one of the selection signal lines on one of the sides, and may perform a counter-stress mode in which a gate-off voltage is applied to the one of the selection signal lines while a high-level voltage is applied to the scanning connection line on the other side, a low-level voltage being applied to the scanning connection line on the one of sides to which the pulse signal is supplied in synchronization with a timing to supply the pulse signal in the counter-stress mode.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

As used herein, the phrase "at least one of" preceding a series of items, with the term "and" or "or" to separate any of the items, modifies the list as a whole, rather than each member of the list (e.g., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A display device comprising:
   an image display area that includes a plurality of pixels sectioned by a plurality of scanning signal lines and a plurality of video signal lines;
   a plurality of first scanning connection lines connected to the plurality of scanning signal lines;
   a plurality of first thin film transistors that are interposed between the scanning signal lines and the first scanning connection lines, each of the scanning signal lines and each of the first scanning connection lines being connected to a source electrode and a drain electrode of a corresponding one of the first thin film transistors, the plurality of first thin film transistors including a first group of first thin film transistors and a second group of first thin film transistors;
   a plurality of first selection signal lines, wherein one of the plurality of first selection signal lines is connected to a gate electrode of each of the first thin film transistors of the first group of first thin film transistors, each of the first thin film transistors of the first group of the first thin film transistors being connected to a different one of the first scanning connection lines;
   a plurality of second scanning connection lines connected to the plurality of scanning signal lines;
   a plurality of second thin film transistors that are interposed between the scanning signal lines and the second scanning connection lines, each of the scanning signal lines and each of the second scanning connection lines being connected to a source electrode and a drain electrode of a corresponding one of the second thin film transistors, the plurality of second thin film transistors including a third group of second thin film transistors and a fourth group of second thin film transistors;
   a plurality of second selection signal lines, wherein one of the plurality of second selection signal lines is connected to a gate electrode of each of the second thin film transistors of the third group of second thin film transistors, the third group of second thin film transistors, which correspond to the first group of first thin film transistors that are connected to the one of the plurality of first selection signal lines, being connected to the one of the plurality of second selection signal lines; and
   a scanning signal drive circuit connected to the first scanning connection lines, the first selection signal lines, and the second selection signal lines, the scanning signal drive circuit being located in a periphery area outside of the image display area.
   wherein the scanning signal drive circuit sequentially supplies a pulse signal to the first scanning connection lines in a selection period in which a gate-on voltage is applied to the one of the plurality of first selection signal lines, and
   the scanning signal drive circuit applies a gate-off voltage to the one of the plurality of second selection signal lines corresponding to the one of the plurality of first selection signal lines to which the gate-on voltage is applied.

2. The display device according to claim 1, wherein
   a low-level voltage is applied to the second scanning connection lines, and
   the scanning signal drive circuit applies a gate-on voltage to the second selection signal lines except for the one of the plurality of second selection signal lines corresponding to the one of the plurality of first selection signal lines to which the gate-on voltage is applied.

3. The display device according to claim 1, wherein the first scanning connection lines, the first thin film transistors, and the first selection signal lines are provided on one side of the scanning signal lines, and
   the second scanning connection lines, the second thin film transistors, and the second selection signal lines are provided on the other side of the scanning signal lines.

4. A display device comprising:
   an image display area that includes a plurality of pixels sectioned by a plurality of scanning signal lines and a plurality of video signal lines;
   a plurality of first scanning connection lines connected to the plurality of scanning signal lines;
   a plurality of first thin film transistors that are interposed between the scanning signal lines and the first scanning connection lines, each of the scanning signal lines and each of the first scanning connection lines being connected to a source electrode and a drain electrode of a corresponding one of the first thin film transistors, the plurality of first thin film transistors including a first group of first thin film transistors and a second group of first thin film transistors;
   a plurality of first selection signal lines, wherein one of the plurality of first selection signal lines is connected to a gate electrode of each of the first thin film transistors of the first group of first thin film transistors, each of the first thin film transistors of the first group of the first thin film transistors being connected to a different one of the first scanning connection lines;
   at least one second scanning connection line connected to each of the plurality of scanning signal lines;

a plurality of second thin film transistors that are interposed between the scanning signal lines and the second scanning connection line, each of the scanning signal lines and the second scanning connection line being connected to a source electrode and a drain electrode of a corresponding one of the second thin film transistors, the plurality of second thin film transistors including a third group of second thin film transistors and a fourth group of second thin film transistors;

a plurality of second selection signal lines, wherein one of the plurality of second selection signal lines is connected to a gate electrode of each of the second thin film transistors of the third group of second thin film transistors, the third group of second thin film transistors, which correspond to the first group of first thin film transistors that are connected to the one of the plurality of first selection signal lines, being connected to the one of the plurality of second selection signal lines; and a scanning signal drive circuit connected to the first scanning connection lines, the first selection signal lines, and the second selection signal lines, the scanning signal drive circuit being located in a periphery area outside of the image display area.

wherein the scanning signal drive circuit sequentially supplies a pulse signal to the first scanning connection lines in a selection period in which a gate-on voltage is applied to the one of the plurality of first selection signal lines, and the scanning signal drive circuit applies a gate-off voltage to the one of the plurality of second selection signal lines corresponding to the one of the plurality of first selection signal lines to which the gate-on voltage is applied.

5. The display device according to claim 4, wherein the second scanning connection line is not connected to the scanning signal drive circuit.

6. The display device according to claim 4, wherein the first scanning connection lines, the first thin film transistors, the first selection signal lines, the second scanning connection line, the second thin film transistors, and the second selection signal lines are provided on one side of the scanning signal lines.

7. The display device according to claim 4, wherein the first scanning connection lines, the first thin film transistors, and the first selection signal lines are provided on one side of the scanning signal lines, and the second scanning connection line, the second thin film transistors, and the second selection signal line are provided on the other side of the scanning signal lines.

8. The display device according to claim 4, wherein the first scanning connection lines, the first thin film transistors, the first selection signal lines, the second scanning connection line, the second thin film transistors, and the second selection signal lines are provided on each side of the scanning signal lines.

9. The display device according to claim 8, wherein the scanning signal drive circuit alternately performs a first mode in which the pulse signal is sequentially supplied to the first scanning connection lines in the selection period in which the gate-on voltage is applied to one of the first selection signal lines on one side of the scanning signal lines and a second mode in which the pulse signal is sequentially supplied to the first scanning connection lines in the selection period in which the gate-on voltage is applied to one of the first selection signal lines on the other side of the scanning signal lines.

10. The display device according to claim 8, wherein the scanning signal drive circuit alternately performs a first mode in which the gate-off voltage is applied to second selection signal lines, of the second selection signal lines, corresponding to the first selection signal lines to which the gate-on voltage is applied on one side of the scanning signal lines, and a second mode in which the gate-off voltage is applied to the second selection signal lines, of the second selection signal lines, corresponding to the first selection signal lines to which the gate-on voltage is applied on the other side of the scanning signal lines.

11. The display device according to claim 8, wherein the scanning signal drive circuit sequentially supplies the pulse signal to the first scanning connection lines in the selection period in which the gate-on voltage is applied to one of the first selection signal lines on both sides of the scanning signal lines.

12. The display device according to claim 8, wherein the scanning signal drive circuit applies the gate-off voltage to the second selection signal line, of the second selection signal lines, corresponding to the first selection signal line to which the gate-on voltage is applied on both sides of the scanning signal lines.

13. A display device comprising:
an image display area that includes a plurality of pixels sectioned by a plurality of scanning signal lines and a plurality of video signal lines;
a plurality of scanning connection lines connected to the plurality of scanning signal lines;
a plurality of thin film transistors that are interposed between the scanning signal lines and the scanning connection lines, each of the scanning signal lines and each of the scanning connection lines being connected to a source electrode and a drain electrode of a corresponding one of the thin film transistors, the plurality of thin film transistors including a first group of thin film transistors and a second group of thin film transistors;
a plurality of selection signal lines, wherein one of the plurality of selection signal lines is connected to a gate electrode of each of the thin film transistors of the first group of thin film transistors, each of the thin film transistors of the first group of thin film transistors being connected to a different one of the scanning connection lines; and
a scanning signal drive circuit connected to the scanning connection lines and the selection signal lines, the scanning signal drive circuit being located in a periphery area outside of the image display area,
wherein a number of scanning connection lines is larger than a number of thin film transistors connected to the one of the plurality of selection signal lines.

14. The display device according to claim 13, wherein the scanning signal drive circuit sequentially outputs a pulse signal to a scanning connection line of the plurality of scanning connection lines connected to a thin film transistor which is connected to the first selection signal line in a first selection period in which a gate-on voltage is applied to the first selection signal line in the selection signal lines, and the scanning signal drive circuit outputs the pulse signal to a scanning connection line of the plurality of scanning connection lines not connected to the thin film transistor which is connected to the first selection signal line while starting a second selection period in which the gate-on voltage is applied to a second selection signal line in the selection signal lines before the first selection period is ended.

15. The display device according to claim 14, wherein the scanning signal drive circuit sequentially outputs the pulse signal having a time width longer than one horizontal scanning period such that a next pulse signal rises before a preceding pulse signal falls.

16. The display device according to claim 14, wherein rising timing of the pulse signal output to the scanning connection line is earlier than a supply start timing at which a video signal voltage corresponding to a pixel value is supplied from each of the video signal lines to the pixel corresponding to the scanning connection line.

17. The display device according to claim 14, wherein the scanning signal drive circuit supplies a high-level voltage to the scanning connection line not connected to the thin film transistor which is connected to the first selection signal line in the first selection period.

18. The display device according to claim 17, wherein the scanning signal drive circuit starts the second selection period after switching a voltage, which is supplied to the scanning connection line not connected to the thin film transistor which is connected to the first selection signal line, from the high-level voltage to a low-level voltage.

19. The display device according to claim 17, wherein the scanning signal drive circuit switches a voltage, which is supplied to the scanning connection line not connected to the thin film transistor which is connected to the second selection signal line, from a low-level voltage to the high-level voltage after ending the first selection period.

* * * * *